(12) United States Patent
Fok et al.

(10) Patent No.: US 11,775,810 B2
(45) Date of Patent: Oct. 3, 2023

(54) METHODS AND APPARATUS FOR THREAD-BASED SCHEDULING IN MULTICORE NEURAL NETWORKS

(71) Applicant: Femtosense, Inc., San Bruno, CA (US)

(72) Inventors: Sam Brian Fok, San Leandro, CA (US); Alexander Smith Neckar, Redwood City, CA (US)

(73) Assignee: Femtosense, Inc., San Bruno, CA (US)

( * ) Notice: Subject to any disclaimer, the term of this patent is extended or adjusted under 35 U.S.C. 154(b) by 0 days.

(21) Appl. No.: 18/149,142

(22) Filed: Jan. 2, 2023

(65) Prior Publication Data

US 2023/0153595 A1 May 18, 2023

Related U.S. Application Data

(62) Division of application No. 17/367,521, filed on Jul. 5, 2021, now Pat. No. 11,625,592.

(Continued)

(51) Int. Cl.
  *G06F 9/38* (2018.01)
  *G06N 3/063* (2023.01)
  (Continued)

(52) U.S. Cl.
  CPC ........... *G06N 3/063* (2013.01); *G06F 9/3802* (2013.01); *G06F 9/3818* (2013.01);
  (Continued)

(58) Field of Classification Search
  CPC .... G06N 3/063; G06N 3/0454; G06N 3/0481; G06N 3/10; G06N 3/08; G06F 9/3802; G06F 9/3818; G06F 9/3836; G06F 9/3838; G06F 9/3851; G06F 9/3885; G06F 9/48; G06F 11/3024; G06F 11/3433; G06F 15/7807; G06F 16/901; G06F 17/16; G06F 9/3001; G06F 9/30036; G06F 9/3016;
  (Continued)

(56) References Cited

U.S. PATENT DOCUMENTS 17,367,512    7/2021   Fok
17,367,517    7/2021   Fok
(Continued)

OTHER PUBLICATIONS

"AMBA AXI and ACE Protocol Specification, Issue H.c." to Arm Limited, published Jan. 26, 2021.

*Primary Examiner* — Shawn Doman
(74) *Attorney, Agent, or Firm* — Wang Hardoon, P.C.

(57) ABSTRACT

Systems, apparatus, and methods for thread-based scheduling within a multicore processor. Neural networking uses a network of connected nodes (aka neurons) to loosely model the neuro-biological functionality found in the human brain. Various embodiments of the present disclosure use thread dependency graphs analysis to decouple scheduling across many distributed cores. Rather than using thread dependency graphs to generate a sequential ordering for a centralized scheduler, the individual thread dependencies define a count value for each thread at compile-time. Threads and their thread dependency count are distributed to each core at run-time. Thereafter, each core can dynamically determine which threads to execute based on fulfilled thread dependencies without requiring a centralized scheduler.

20 Claims, 13 Drawing Sheets

Related U.S. Application Data

(60) Provisional application No. 63/050,090, filed on Jul. 9, 2020.

(51) Int. Cl.
| | |
|---|---|
| *G06F 11/30* | (2006.01) |
| *G06F 11/34* | (2006.01) |
| *G06F 16/901* | (2019.01) |
| *G06F 17/16* | (2006.01) |
| *G06N 3/10* | (2006.01) |
| *H03M 7/30* | (2006.01) |
| *G06F 15/78* | (2006.01) |
| *G06F 9/48* | (2006.01) |
| *G06N 3/045* | (2023.01) |
| *G06N 3/048* | (2023.01) |
| *G06F 15/16* | (2006.01) |

(52) U.S. Cl.
CPC .......... *G06F 9/3836* (2013.01); *G06F 9/3838* (2013.01); *G06F 9/3851* (2013.01); *G06F 9/3885* (2013.01); *G06F 9/48* (2013.01); *G06F 11/3024* (2013.01); *G06F 11/3433* (2013.01); *G06F 15/16* (2013.01); *G06F 15/7807* (2013.01); *G06F 16/901* (2019.01); *G06F 17/16* (2013.01); *G06N 3/045* (2023.01); *G06N 3/048* (2023.01); *G06N 3/10* (2013.01); *H03M 7/702* (2013.01)

(58) Field of Classification Search
CPC ... H03M 7/702; H03M 7/3082; H03M 7/6023
See application file for complete search history.

(56) References Cited

U.S. PATENT DOCUMENTS

| | | |
|---|---|---|
| 17,367,521 | 7/2021 | Fok |
| 18,049,453 | 10/2022 | Fok |
| 2007/0220517 A1 | 9/2007 | Lippett |
| 2007/0283357 A1 | 12/2007 | Jeter et al. |
| 2014/0306970 A1* | 10/2014 | Surti ................ G06F 9/3851 345/522 |
| 2015/0379668 A1* | 12/2015 | Weissmann ........ G06F 9/5083 345/522 |
| 2018/0113713 A1 | 4/2018 | Cheng et al. |
| 2019/0349318 A1 | 11/2019 | Fok et al. |
| 2020/0019837 A1 | 1/2020 | Boahen et al. |
| 2022/0012060 A1 | 1/2022 | Fok et al. |
| 2022/0012575 A1 | 1/2022 | Fok et al. |
| 2022/0012598 A1 | 1/2022 | Fok et al. |

\* cited by examiner

METHODS AND APPARATUS FOR THREAD-BASED SCHEDULING IN MULTICORE NEURAL NETWORKS

PRIORITY

This application is a divisional of, and claims the benefit of priority to U.S. patent application Ser. No. 17/367,521 filed Jul. 5, 2021 and entitled "METHODS AND APPARATUS FOR THREAD-BASED SCHEDULING IN MULTICORE NEURAL NETWORKS", that claims the benefit of priority to U.S. Provisional Patent application Ser. No. 63/050,090 filed Jul. 9, 2020 and entitled "METHODS AND APPARATUS FOR LOCALIZED PROCESSING WITHIN MULTICORE NEURAL NETWORKS", each of which are incorporated herein by reference in its entirety.

STATEMENT REGARDING FEDERALLY SPONSORED RESEARCH OR DEVELOPMENT

This invention was made with Government support under Agreement No. N00014-19-9-0003, awarded by ONR. The Government has certain rights in the invention.

RELATED APPLICATIONS

This application is related to U.S. patent application Ser. No. 17/367,512 filed Jul. 5, 2021 and entitled "METHODS AND APPARATUS FOR LOCALIZED PROCESSING WITHIN MULTICORE NEURAL NETWORKS", and U.S. patent application Ser. No. 17/367,517 filed Jul. 5, 2021 and entitled "METHODS AND APPARATUS FOR MATRIX AND VECTOR STORAGE AND OPERATIONS", each of which are incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

TECHNICAL FIELD

This disclosure relates generally to the field of neural networking. More particularly, the present disclosure is directed to hardware, software, and/or firmware implementations of neural network processing.

DESCRIPTION OF RELATED TECHNOLOGY

Incipient research is directed to so-called "neural network" computing. Unlike traditional computer architectures, neural network processing emulates a network of connected nodes (aka neurons) that loosely model the neuro-biological functionality found in the human brain. While neural network computing is still in its infancy, such technologies already have great promise for e.g., compute rich, low power, and/or continuous processing applications.

Existing neural networks are most commonly emulated within general-purpose programming environments because commodity hardware and software compilers are well understood and readily available. Unfortunately, such implementations suffer from many inefficiencies due to e.g., hardware limitations (e.g., physical connectivity), compiler design, and/or instruction scheduling. Neural networks would be a great fit for parallel processing and distributed computing models; however, corresponding changes to hardware and compilers are needed.

SUMMARY

The present disclosure addresses the foregoing needs by disclosing, inter alia, methods, devices, systems, and computer programs for thread-based scheduling within multicore network processors.

In one aspect, systems, methods, and apparatus for thread-based scheduling are disclosed. One exemplary apparatus includes: a scoreboard configured to store thread dependency counts for one or more threads; a ready queue configured to identify unblocked threads of the one or more threads; an instruction fetch/instruction decode lane configured to fetch one or more instructions corresponding to an execution thread; an issue controller configured to issue the one or more instructions corresponding to the execution thread to an execution unit; the execution unit configured to perform operations based on the one or more instructions corresponding to the execution thread; and where a first instruction of the one or more instructions updates the thread dependency counts for the one or more threads. In a related embodiment, a method to perform the foregoing techniques is described. In one exemplary embodiment, the method includes storing thread dependency counts for one or more threads; identifying unblocked threads of the one or more threads; fetching one or more instructions corresponding to an execution thread; issuing the one or more instructions corresponding to the execution thread to an execution unit; performing operations based on the one or more instructions corresponding to the execution thread; and updating the thread dependency counts for the one or more threads In one aspect, systems, methods, and apparatus for thread-based scheduling are disclosed. One exemplary method includes: monitoring thread states of a thread pool in a control path logic of a core of the multicore processor, where the thread states of the thread pool are specific to the core of the multicore processor; determining when a first thread of the thread pool is ready for execution; assigning a processor resource to the first thread; monitoring a utilization of the processor resource by the first thread; and updating a first thread state of the thread pool in the control path logic. In a related embodiment, apparatus configured to perform the foregoing techniques is described. One exemplary apparatus includes: logic to monitor thread states of a thread pool in a control path logic of a core of the multicore processor, where the thread states of the thread pool are specific to the core of the multicore processor; logic to determine when a first thread of the thread pool is ready for execution; logic to assign a processor resource to the first thread; monitoring a utilization of the processor resource by the first thread; and logic to update a first thread state of the thread pool in the control path logic.

In one aspect, systems, methods, and apparatus for thread-based scheduling are disclosed. One exemplary multicore processor includes: a first core and a dedicated first control path logic configured to store a first set of thread states; a second core and a dedicated second control path logic configured to store a second set of thread states; and at least one router configured to asynchronously connect the first core to the second core, where the first core comprises at least one instruction, that when executed by the first core, synchronously updates the first set of thread states of the first core, independently of the second core. In a related embodiment, methods configured to perform the foregoing techniques is described. One exemplary method includes: storing a first set of thread states; storing a second set of thread states; asynchronously communicating between cores; and synchronously updating the first set of thread states, independently of the second set of thread states.

Other features and advantages of the present disclosure will immediately be recognized by persons of ordinary skill in the art with reference to the attached drawings and detailed description of exemplary embodiments as given below.

DETAILED DESCRIPTION

In the following detailed description, reference is made to the accompanying drawings which form a part hereof wherein like numerals designate like parts throughout, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without departing from the spirit or scope of the present disclosure. It should be noted that any discussion herein regarding "one embodiment", "an embodiment", "an exemplary embodiment", and the like indicate that the embodiment described may include a particular feature, structure, or characteristic, and that such particular feature, structure, or characteristic may not necessarily be included in every embodiment. In addition, references to the foregoing do not necessarily comprise a reference to the same embodiment. Finally, irrespective of whether it is explicitly described, one of ordinary skill in the art would readily appreciate that each of the particular features, structures, or characteristics of the given embodiments may be utilized in connection or combination with those of any other embodiment discussed herein.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The Complexity of Software-Based Neural Networks

Figure 1:
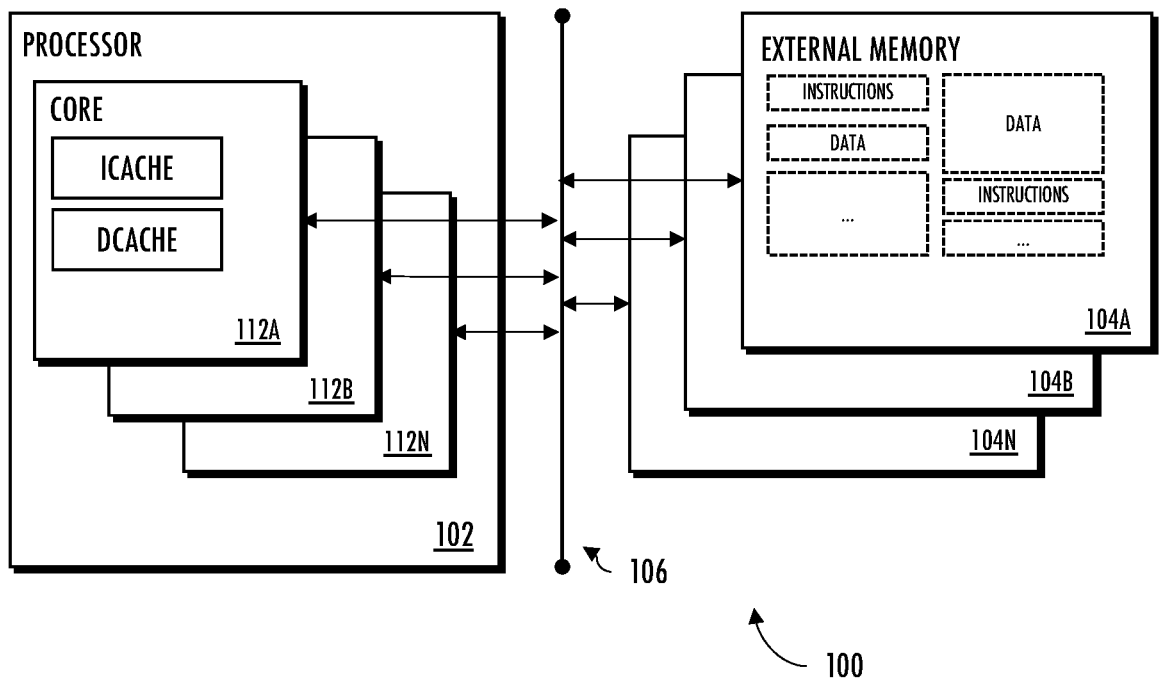
FIG. 1 is a graphical representation of a multicore processor architecture, commonly used within the processing arts.
Figure 1:
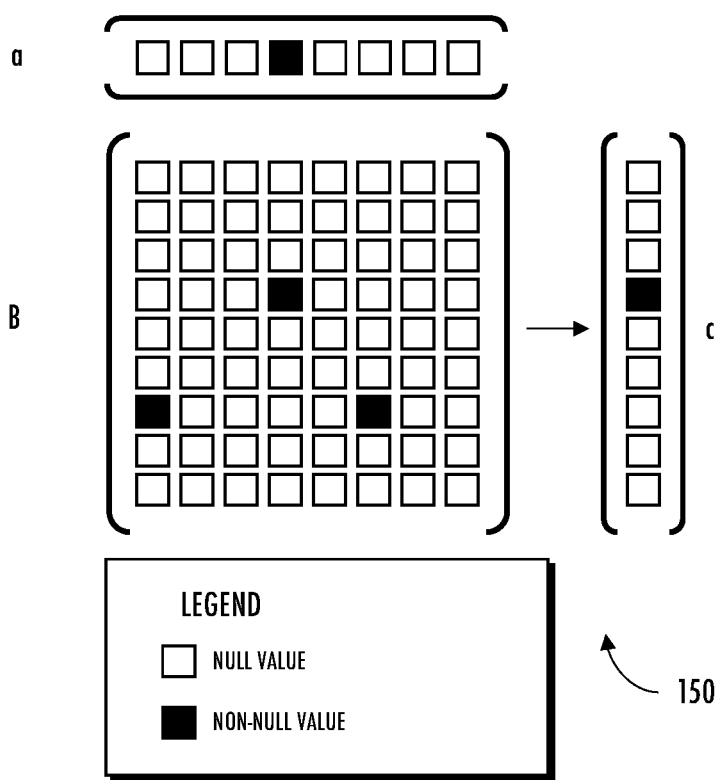

FIG. 1 is a graphical representation of a multicore processor architecture 100, commonly used within the processing arts. The multicore processor 102 may include one or more cores 112A, 112B . . . 112N. Each core may include logic (e.g., arithmetic logic units (ALUs), registers, etc.) arranged to perform various control and data path operations. Examples of control and data path operations may include without limitation: instruction fetch/instruction decode (IF/ID), operation execution and addressing, memory accesses, and/or data write back. A small amount of frequently used instructions and data may be locally cached "on-chip" for fast access; otherwise, "off-chip" storage provides cost-effective storage of bulk data (104A, 104B . . . 104N).

During operation, the processor cores 112A, 112B . . . 112N read and write computer instructions and/or data from the external memories 104A, 104B . . . 104N via a shared bus interface 106. Each computer instruction (also referred to as an "opcode") identifies the operation to be sequentially performed based on one or more operands (data, register locations, and/or memory addresses). By linking together sequences of computer instructions, it is possible to compute any computable sequence.

In "general-purpose" computing, the processor cores and memories may be tasked with any arbitrary task. A shared bus architecture and monolithic memory map flexibly allows every core 112A, 112B . . . 112N to access any memory location within the external memories 104A, 104B . . . 104N. As a practical matter, however, the shared bus interface 106 is physically pin-limited; there is a fixed width data bus that services all processor-memory connections one-at-a-time. Limited connectivity can significantly affect performance where multiple cores try to access the memories at the same time. Additionally, local cache sizes are limited; reading and writing to large data structures may require multiple "off-chip" transactions across the pin-limited bus. Finally, "global" data structures cannot be accessed by more than one core at a time (simultaneous access could result in data hazards and race conditions).

Unlike general-purpose computing, so-called "neural network" computing uses biologically-inspired algorithms that take their inspiration from the human brain. Neural networks are characterized by a multi-layered composition of high-dimensional linear and non-linear functions. The intermediate function outputs between layers are known as activations. Neural networks typically contain a large number of parameters that are used for e.g., vector-matrix operations. The parameters are tuned in a gradient descent training process based on known input/output data pairings. After training, the parameters are held constant during deployment as the neural network processes novel input data to execute its trained task. For example, FIG. 1 graphically depicts one exemplary neural network computation that is performed as a vector-matrix multiplication 150. As shown therein, neural activations are modeled as a vector of digital values (a) that are multiplied by a matrix of parameter weights (B) for the neural network; the output (c) corresponds to the output neural activations.

Unfortunately, naïvely allocating neural network processing to the multicore processor architecture 100 is extremely inefficient. Firstly, each of the cores 112A, 112B, . . . 112N must access the complete set of neural network data structures. The vector and matrix dimensions are a function of the number of nodes (neurons) within the neural network, thus neural networks of any significant size exceed data sizes that can be efficiently cached on-chip. As a result, all of the cores 112A, 112B, . . . 112N constantly move data across the pin-limited bus interface 106. Additionally, each of the cores 112A, 112B, . . . 112N read and write to the same data structures (a, B, c) and often block one another.

As a related issue, "Big O" notation is used in the computer arts to classify algorithms according to computational complexity (run time and space requirements O, as a function of input size N.) Big O notation is widely used to describe the limiting behavior of a function as it increases, e.g., processing complexity, memory storage, bandwidth utilization, etc. For example, vector-matrix multiplication has a computational complexity of $O(N^2)$ for vector size (N) because each element of the vector must be multiplied by a corresponding element of each row and column of the matrix. Doubling the vector size (N) quadruples the computational complexity ($O(N^2)$).

Referring back to FIG. 1, existing neural networking solutions rely on general-purpose vector-matrix operations. Such solutions often rely on hardware accelerators to perform "brute-force" element-by-element calculation. However, the data structures that are used in neural network processing can be made to be quite sparse (a high ratio of null values.) Brute force vector-matrix operations can be particularly inefficient for sparse data structures because the vast majority of memory reads, vector-matrix multiplications, and memory write-backs are unnecessary (null valued). Furthermore, as neural networks continue to grow in size and complexity, inefficient brute force solutions will quadratically increase in complexity.

Substantial factors in neural network energy consumption may include moving large amounts of data, and storing a large number of parameters in leaky SRAM (static random access memory). Charging and discharging wires to transfer data takes energy. Wire energy costs scale with wire length (e.g., chip area) and is a significant concern for chip design. As a related issue, neural networks are parameter-rich, but on-chip SRAM memory is costly to implement. On-chip SRAM is optimized for performance, not power consumption, so SRAM cells may consume significant amounts of energy even when idle, due to leakage. The combination of these factors can limit neural network adoption; in one specific example, remote applications are often power constrained.

Exemplary Multicore Architecture

The aforementioned complexities of neural network processing have presented significant issues for embedded device implementations. Notably, existing neural network implementations are handled within software, without regard to the underlying hardware platform limitations; unfortunately, physical connectivity (e.g., pin limitations), computational complexity, and/or scheduling overhead present significant obstacles for embedded devices. More directly, improved solutions for handling neural networks in embedded environments are needed; ideally, such solutions should enable compute rich, low power, and/or continuous processing applications.

To these ends, various principles described herein synergistically leverage locality, sparsity, and distributed scheduling, to enable neural network processing within embedded hardware applications. Unlike existing solutions that rely on commodity software and hardware to perform "brute force" large scale neural network processing; the various techniques described herein map and partition a neural network based on the hardware limitations of a target platform. The exemplary hardware-aware mapping/partitioning described herein enhances neural network performance by e.g., avoiding pin-limited memory accesses, processing data in compressed formats/skipping unnecessary operations, and distributing task scheduling while decoupling timing requirements between cores.

Figure 2A:
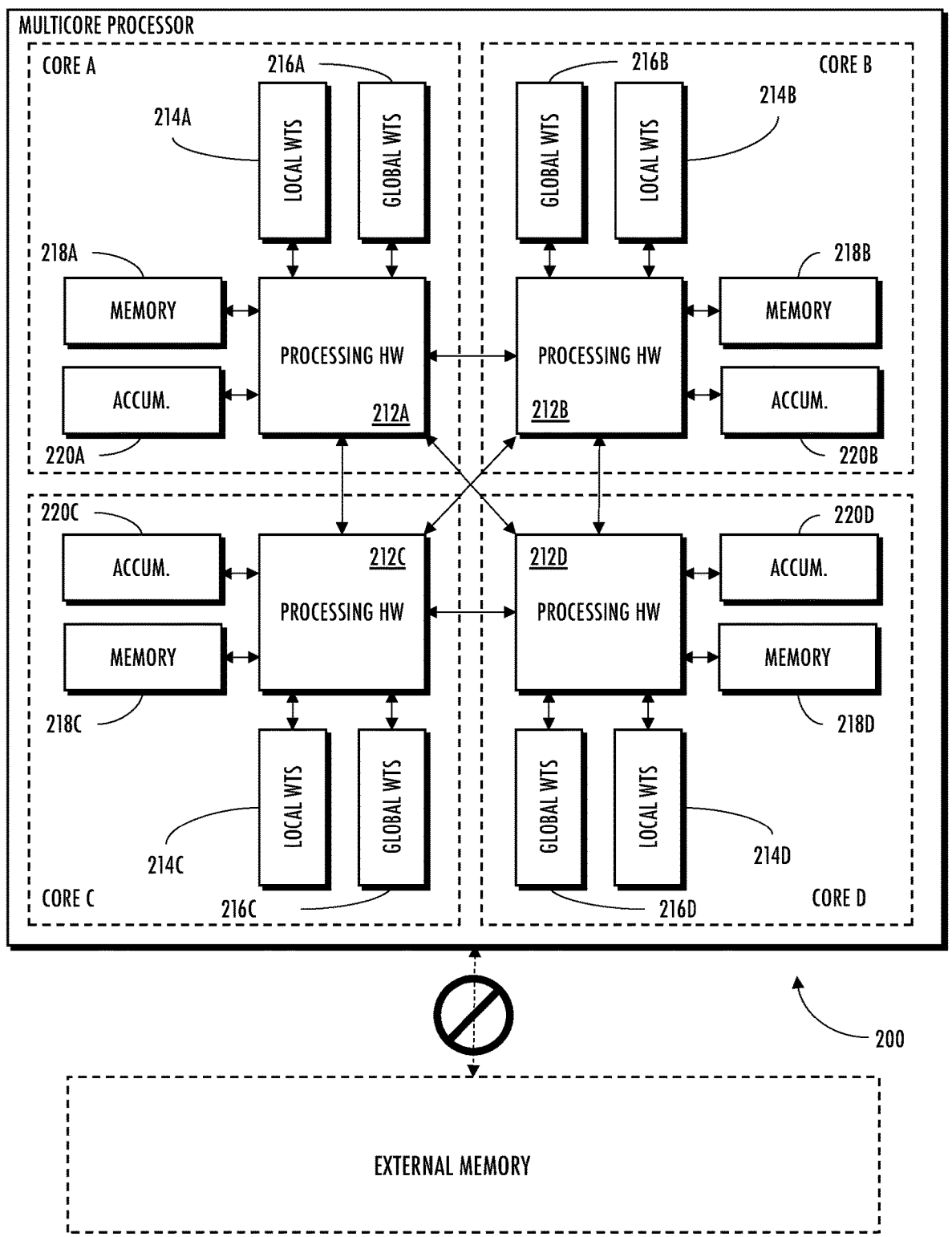
FIG. 2A is a graphical representation of one exemplary multicore architecture, in accordance with the various principles described herein.

FIG. 2A is a graphical representation of one exemplary multicore architecture 200, in accordance with the various principles described herein. As shown, the architecture 200 does not use an external memory to store the neural network data structures nor any intermediate results. Instead, each core includes its own processing hardware (212A, 212B, 212C, 212D), local weights (214A, 214B, 214C, 214D), global weights (216A, 216B, 216C, 216D), working memory (218A, 218B, 218C, 218D), and accumulator (220A, 220B, 220C, 220D). While the following discussion is presented in the context of a core with its own dedicated memories, the techniques described herein may be used in shared memory systems and/or hybrids thereof. More generally, dedicated core resources may enable improved core performance whereas shared resources across cores may provide flexibility and/or cross-core communication opportunities.

As shown in FIG. 2A, the local neighborhood weights are stored in the local weight memories (214A, 214B, 214C, 214D) and each core's subset (or "slice") of the global network weights are stored in the global weight memories (216A, 216B, 216C, 216D). During operation, applicable weights are retrieved from the corresponding memory for computation; intermediate results may be stored within a working memory (218A, 218B, 218C, 218D) and/or accumulator (220A, 220B, 220C, 220D).

Figure 2B:
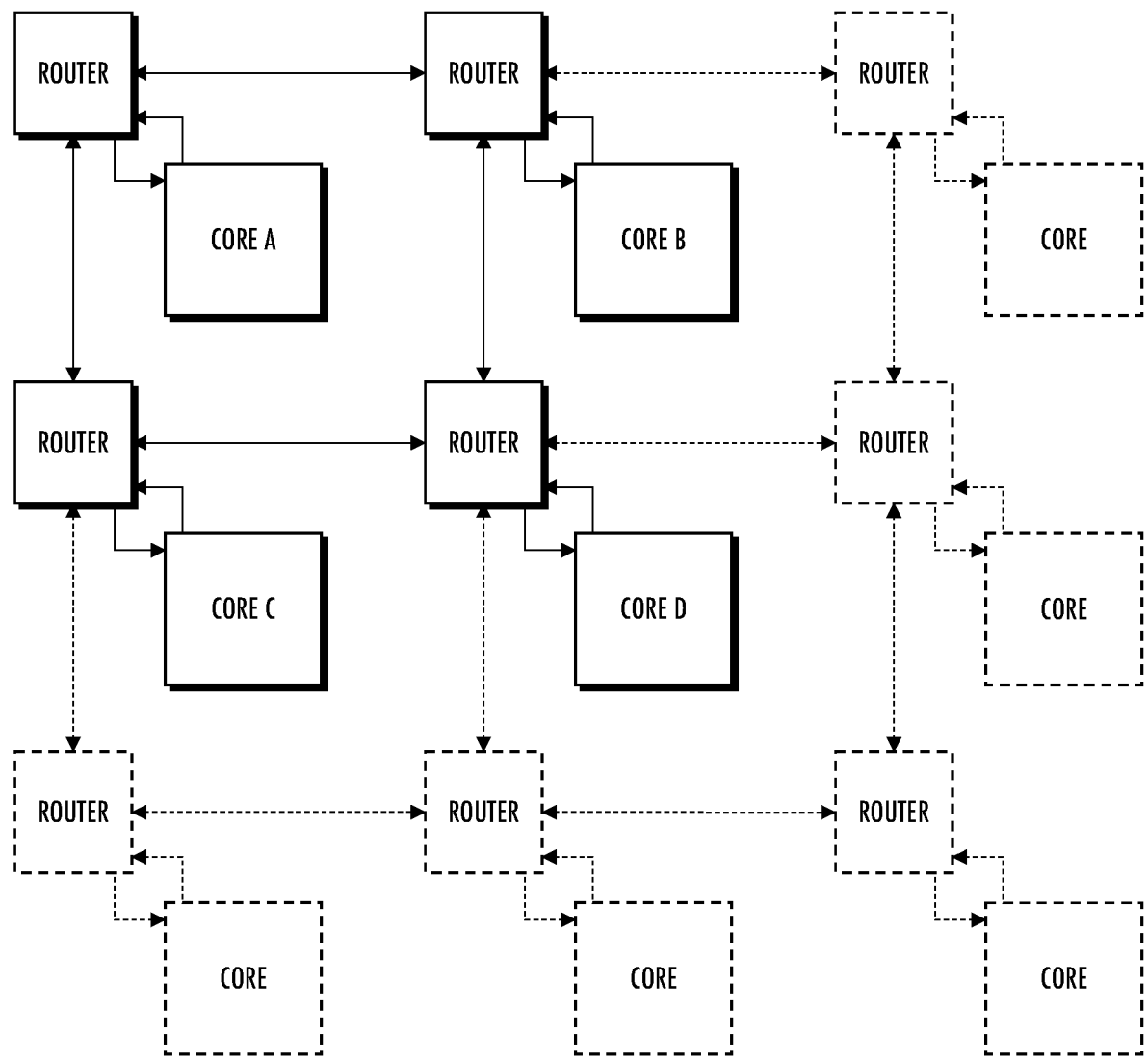
FIG. 2B is a graphical representation of the extensible nature of the multicore architecture, in accordance with the various principles described herein.

While the illustrated embodiment is shown in the context of four (4) cores emulating a global neural network of nodes, the multicore architecture described herein may be broadly extended to any number of cores and/or any number of nodes (see e.g., FIG. 2B). Additionally, the foregoing discussion presented a symmetric distribution, however asymmetric distributions may be substituted with equal success. Partitioning may be scaled to individual core's capabilities and/or application requirements. For example, asymmetric systems may enable high performance cores (more logic, memory, and/or faster clock rates) and low power cores (less logic, less memory, and/or power efficient clocking). In such implementations, matrix operations may be sized so as to complete within operational constraints, given a core's capabilities. Furthermore, any consolidation, division, distribution, agglomeration, and/or combination of processing hardware and/or memory may be substituted by artisans of ordinary skill in the related arts, given the contents of the present disclosure.

Figure 3:
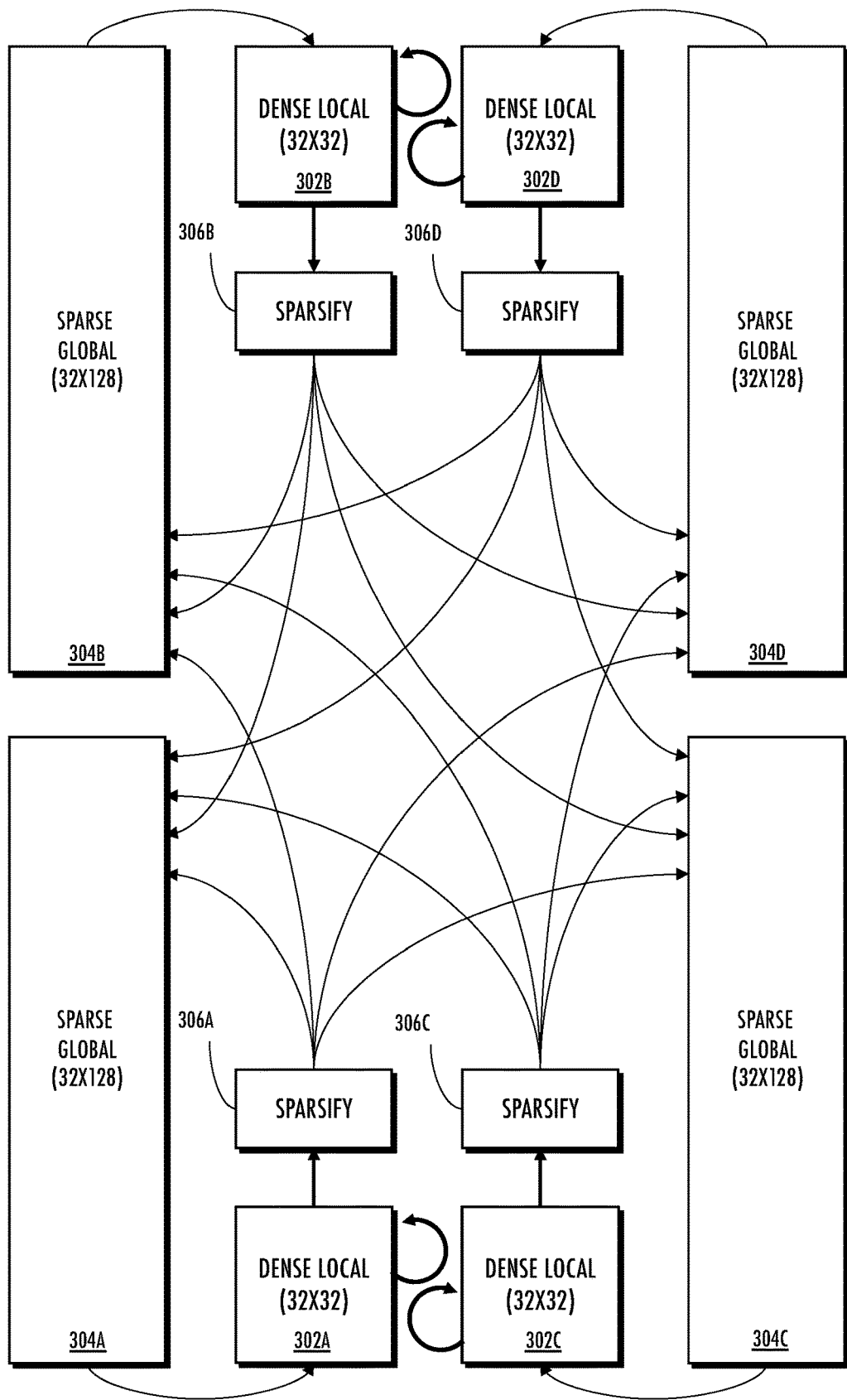
FIG. 3 is a logical block diagram illustrating the data traffic flow throughout the multicore architecture, in accordance with the principles described herein.

FIG. 3 is a logical block diagram illustrating the data traffic flow 300 throughout the multicore architecture, in accordance with the various principles described herein. Each neighborhood (302A, 302B, 302C, 302D) is characterized by a locally dense neural network. Neighborhoods are connected via a global interconnect matrix (304A, 304B, 304C, 304D) to the other neighborhoods; the output of the neighborhoods can be further sparsified prior to global distribution via interconnect logic (306A, 306B, 306C, 306D).

Unlike existing neural network processors which naïvely distribute processing load (discussed supra), the exemplary multicore architecture decouples processing among the cores. For example, as discussed in U.S. patent application Ser. No. 17/367,512 filed Jul. 5, 2021 and entitled "METHODS AND APPARATUS FOR LOCALIZED PROCESSING WITHIN MULTICORE NEURAL NETWORKS", previously incorporated herein by reference in its entirety, the neural network processing may be mathematically transformed (mapped) and spatially partitioned into dense "neighborhood" processing and sparse "global" communications processing. The mapping/partitioning preserves the properties of the original global neural network at a fraction of the memory accesses.

In one such embodiment, a global neural network is mapped into a set of sparsely interconnected, dense neighborhood neural networks that are partitioned based on hardware platform constraints. The transformation may be performed on a modified gated recurrent unit (GRU). Alternative implementations may perform the transformation on modified Long Short-Term Memory (LSTM) or any other "remember-forget" recurrent neural network (RNN) logic. More generally, any logic or component that retains/removes information between nodes of the neural network may be modified to transform a first domain (first vector space) to a second domain (second vector space). By avoiding data path dependencies between cores, the exemplary multicore architecture can maximize parallelism to complete tasks quickly and maximize the time spent in low-power sleep states to mitigate leakage. In one embodiment, each core is a variable-length Single-Instruction-Multiple-Data (SIMD) machine that can execute the same operation (instruction) on multiple data elements in parallel (e.g., a matrix-vector multiply or a pointwise nonlinearity on a vector). Data paths operate in parallel, so multiple instructions can execute simultaneously in a core. Likewise, cores operate in parallel, communicating only when necessary.

As a further optimization, there are overhead costs associated with compression, and different techniques have different costs and benefits. Since vectors and matrices are used differently in neural network processing, these data structures may be represented differently to further enhance performance. For example, as discussed in U.S. patent application Ser. No. 17/367,517 filed Jul. 5, 2021 and entitled "METHODS AND APPARATUS FOR MATRIX AND VECTOR STORAGE AND OPERATIONS", previously incorporated herein by reference in its entirety, exemplary embodiments compress sparse neural network data structures based on actual, non-null, connectivity (rather than all possible connections). This greatly reduces storage requirements as well as computational complexity. In some variants, the compression and reduction in complexity is sized to fit within the memory footprint and processing capabilities of a core. The exemplary compression schemes represent sparse matrices with links to compressed column data structures, where each compressed column data structure only stores non-null entries to optimize column-based lookups of non-null entries. Similarly, sparse vector addressing skips ed entries to optimize for vector-specific non-null multiply-accumulate operations.

Additionally, existing neural network processing relies on a centralized task scheduler that consumes significant processing and transactional overhead to coordinate between cores. In contrast, the sparse global communications between cores of the exemplary multicore architecture decouples neighborhood processing and enables the multicore architecture to asynchronously operate the cores in parallel. Consequently, another aspect described herein enables distributed task coordination between cores and asynchronous handshaking protocols.

As previously alluded to, existing neural network processing is typically performed within the context of commodity servers and/or general-purpose computers. In such contexts, processing bandwidth and memory resources are typically managed by e.g., an operating system (OS) that centrally manages all of the concurrently running tasks for all of the compute resources (cores). Specifically, software processes are ordered (re-ordered) and dispatched to a core for execution by a centralized task scheduler process. Typically, the task scheduler must constantly determine which task should be executed next based on e.g., data path dependencies, priorities, and/or other system considerations. This requires a complex software-based scheduling program, supported at the OS level, and by complicated, but generalizable low-level primitives support for synchronization and parallelization mechanisms e.g., mutexes and threading. Such solutions are impractical for embedded device operation.

The localization techniques described herein decouple neighborhoods from one another. Notably, the aforementioned neighborhood processing is entirely independent and makes up the majority of a core's processing load, whereas global connectivity is sparse and is asynchronously broadcast across all cores. Furthermore, the cores may vary widely in computational load and may finish processing vectors at different times, etc. Consequently, another aspect of the present disclosure is directed to distributed asynchronous scheduling.

Notably, there are many different types of parallelism that may be leveraged in neural network processing. Data-level parallelism refers to operations that may be performed in parallel over different sets of data. Control path-level parallelism refers to operations that may be separately controlled. Thread-level parallelism spans both data and control path parallelism; for instance, two parallel threads may operate on parallel data streams and/or start and complete independently. Various aspects of the present disclosure are directed to leveraging thread-level parallelism and asynchronous handshaking to decouple core-to-core data path dependencies. More directly, the principles described herein enable threads to run independently of one another, without any centralized scheduling and/or resource locking (e.g., semaphore signaling, critical path execution, etc.) Decoupling thread dependencies allows cores to execute threads asynchronously.

In one exemplary embodiment, the multicore architecture includes a set of distributed cores that run in parallel. The cores communicate with each other via an interconnecting network of router nodes. Each core processes its threads asynchronously with respect to the other cores. Most threads correspond to the dense neighborhood, and the core can process these threads independently of the other cores. Global communication is sparse (infrequent) and is handled via an asynchronous handshake protocol.

Exemplary Dependency-Triggered Execution

Various aspects of the present disclosure are directed to a multicore architecture that decouples processing among the cores and plans thread scheduling during compile-time. Thread scheduling in this manner greatly reduces operating system (OS) complexity; in one exemplary embodiment, the compile-time thread scheduling relies on a "scoreboard" count that obviates data path dependency-based thread scheduling at run-time.

Figure 4:
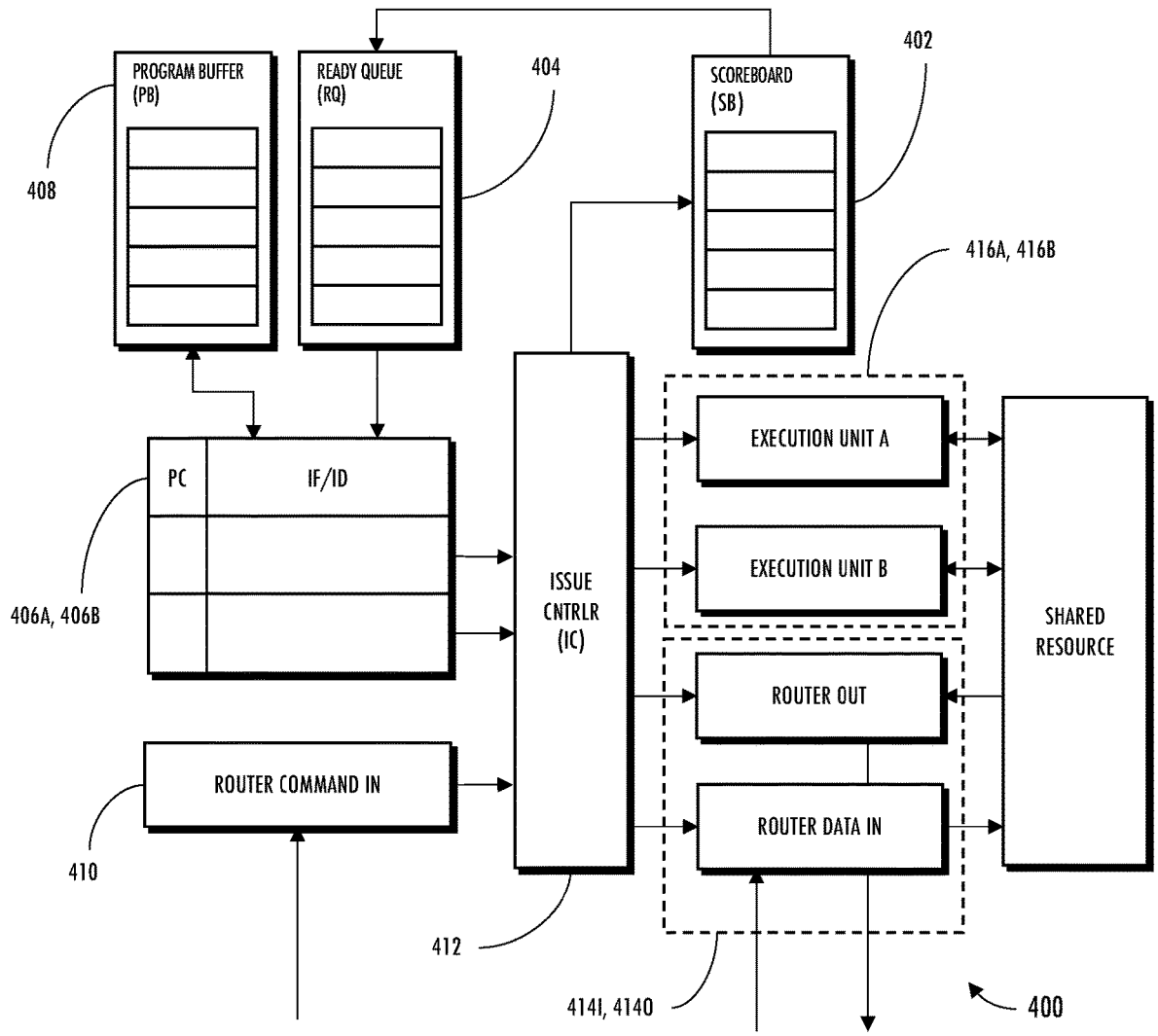
FIG. 4 is a logical block diagram of an exemplary core's control and data path operations, in accordance with the principles described herein.

FIG. 4 is a logical block diagram of an exemplary core's control and data path operations. As shown therein, each core 400 of the multicore architecture includes: a scoreboard 402, a ready queue 404, an instruction fetch/instruction decode (shown with lanes 406A and 406B), a program buffer 408, a router command input 410, an issue controller 412, router input/output 414I, 414O, and execution units and other shared resources (memory, etc.)

In one embodiment, each core maintains its own scoreboard 402 to track thread dependencies. The exemplary scoreboard 402 stores the "score" of each thread and its sleep/awake state. Each thread's score is a number that represents the number of thread dependencies (e.g. data, control dependencies on the actions performed by other threads) that must be satisfied before the thread can be executed. For example, at program start, a given thread's score might be the number of other threads that must complete, each producing data that this thread depends on. When a thread's score drops to zero (indicating that there are no further outstanding dependencies), then the thread can be queued for execution via the ready queue 404.

Notably, traditional scheduling techniques generally fall into two categories: instruction scheduling, and thread prioritization. Instruction scheduling techniques dynamically schedule instructions (not threads) for a processing pipeline so that instructions can execute out of order when there are no conflicts. In instruction schedulers, a data structure (such as a table, scoreboard, etc.) logs the data path dependencies for every instruction. Instructions are only released when the scheduler determines that there are no conflicts with previously issued and incomplete instruction. In contrast, thread prioritization scheduling is often used by an operating system (OS), or similar centralized entity, to schedule thread execution based on holistic system considerations (power, performance, available resources, etc.) Notably, OS schedulers operate at a level of abstraction above thread execution; thus, OS schedulers don't consider (nor have visibility into) each thread's internal considerations. Unlike instruction scheduling and thread prioritization, the exemplary scoreboard 402 accounts for dependencies between threads (referred to throughout as "thread dependencies"). Thread dependencies identify the control and/or data input and outputs to a thread, where each thread is a self-contained sequence of computer instructions.

Referring back to FIG. 4, the exemplary ready queue 404 holds a running list of thread identifiers that are ready for execution. In one exemplary embodiment, the ready queue 404 is a first-in-first-out (FIFO) buffer. Threads are enqueued by the scoreboard 402 when there are no outstanding thread dependencies and are dequeued by the instruction fetcher/instruction decoder (IF/ID) to fill open lanes 406A, 406B (e.g., opened when active threads sleep, complete execution, or otherwise transition to an inactive state). Other implementations may use other queuing schemes including without limitation last-in-first-out (LIFO), priority queuing, round robin, shortest job first, and/or any other queuing scheme.

The instruction fetcher/instruction decoder (IF/ID) fetches and decodes the instructions for active threads. Each lane 406A, 406B of the IF/ID has an associated program counter (PC) that points to the next instruction to be executed. The IF/ID can support one thread for each lane; a greater or fewer number of lanes may be substituted with equal success, the two (2) lane implementation being purely illustrative. During operation, the instruction (opcode and one or more operands) at the PC is fetched and decoded. After each instruction, the PC either increments or jumps to the next instruction. Instructions are executed until a stop condition occurs (e.g., the thread completes, is put to sleep, etc.) When a thread completes, the thread's scoreboard and PC is reset. When a thread sleeps, the thread's return program counter is written to the program buffer 408 and the thread's score is set to the outstanding thread dependencies.

The program buffer 408 stores sleeping threads' return program counters (PCs). The return program counter identifies the next instruction to be executed once the sleeping thread wakes up. As described in greater detail herein, a thread may need to put itself to sleep e.g., to wait for other threads to asynchronously complete. A thread may suspend its operation by issuing a sleep instruction; the sleeping thread is removed from its lane 406A, 406B in the instruction fetch/instruction decode (IF/ID); the return program counter is stored in the program buffer 408, and its score in the scoreboard 402 is reset. When its score has decremented to 0, the thread is queued for execution via the ready queue 404. The thread resumes execution in the IF/ID at the return program counter stored in the program buffer 408.

The issue controller 412 assigns executable instructions from the IF/ID lanes 406A, 406B to an execution unit 416A, 416B, the scoreboard 402, or router input/output (I/O) 414I, 414O. In the illustrated embodiment, the execution units 416A, 416B share a common resource (e.g., memory); thus, in some cases, the issue controller 412 may order instructions based on resource contention considerations. For example, the issue controller 412 may check that both lanes 406A, 406B do not access the same resource; in the event that a resource collision is present, the issue controller 412 may hold off one of the lanes. Other implementations may use a dedicated resource for each execution unit; such implementations may require more hardware but reduce issue controller logic (since collisions are not an issue).

The issue controller 412 may also arbitrate between the core's active threads and instructions received via router command input 410. In some cases, inter-core instructions may be treated as an interrupt; for example, inter-core instructions may interrupt ongoing thread execution. In other cases, intra-core instructions may take precedence over inter-core instructions; inter-core instructions may be held off until intra-core instructions complete.

The exemplary router input/output (I/O) 414I, 414O sends instructions and data to other cores of the multicore of the multicore architecture. For example, a thread in one core may need to e.g., send sparse activation vector data. The router I/O 414I, 414O transacts data with other cores for use with the shared resources (e.g., stored in a memory, etc.) Additionally, inter-core instructions may be passed via the inter-core communications over the routing network. During inter-core operation, the router command input 410 receives instructions sent by other cores of the multicore architecture and parses (and/or generates) the appropriate operand/opcodes for core execution.

Execution units perform arithmetic operations (such as the aforementioned sparse vector-sparse matrix operations described supra.) Shared resources may include memory, registers, and/or any other logic that may be shared and accessible by the execution units and router I/O 414I, 414O.

Figure 5:
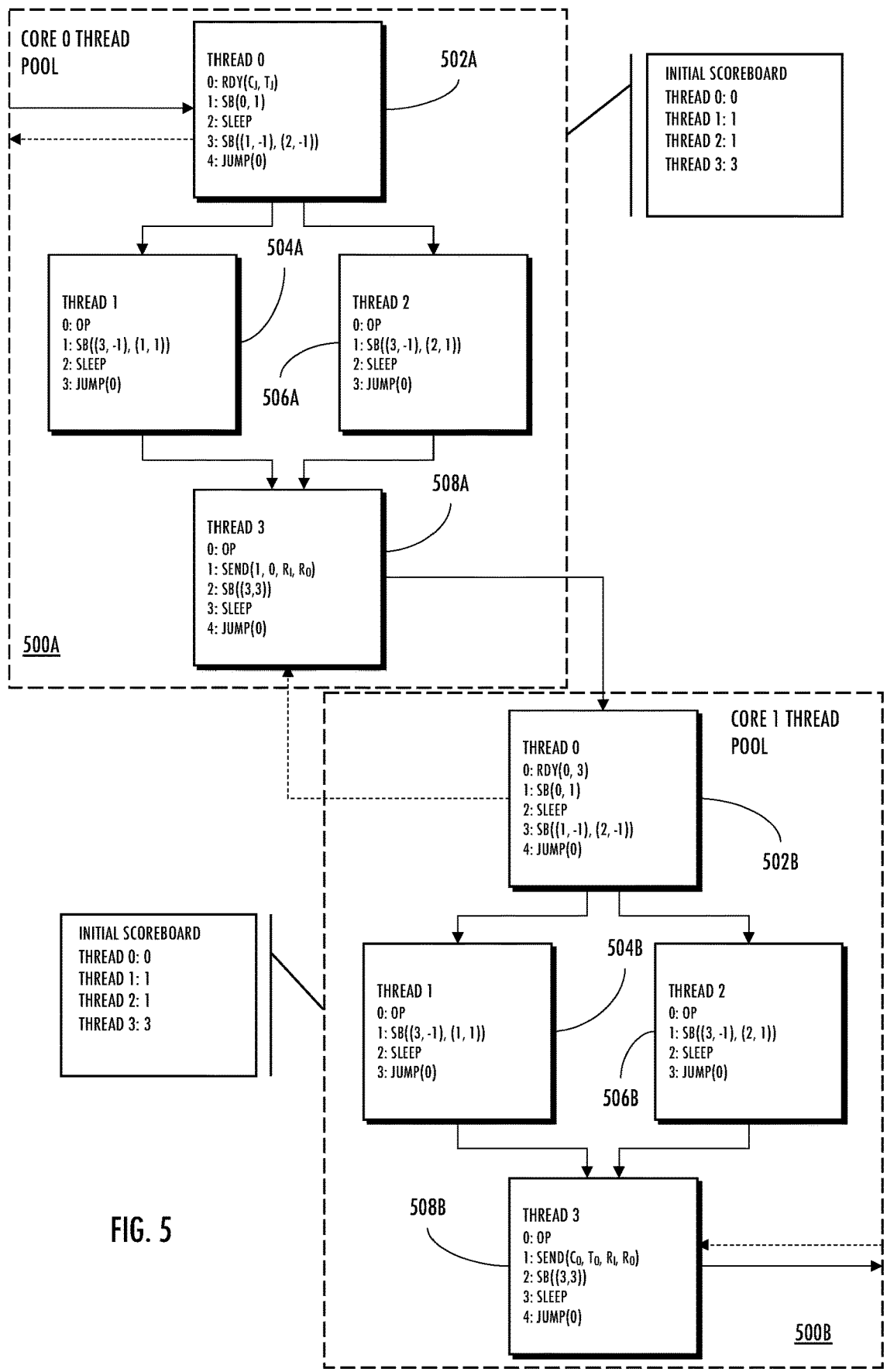
FIG. 5 is a logical block diagram of one exemplary thread dependency graph between two cores, in accordance with the principles described herein.

Referring now to FIG. 5, one exemplary thread dependency graph between two (2) cores 500A, 500B is presented. As shown therein, a computation is implemented as a number of threads, where each thread may be composed of one or more instructions. The thread graph represents each thread as a node, and the edges of the graph describe the data path dependencies between threads. For example, threads 504A and 506A of core 500A require data produced by thread 502A; the thread dependencies are represented with a directional edge from thread 502A to threads 504A and 506A. Threads which have no outstanding dependencies may be run in parallel (e.g., threads 504A, 506A and 504B, 506B may be parallelized).

As a brief aside, thread dependency graphs are a useful tool to analyze relationships between threads; historically, software designers have designed software based on thread dependency graphs. Such software may be explicitly ordered at compile time (via compiler flags, etc.) so as to ensure that thread dependencies are preserved. In other words, the thread execution order is reflected in the static structure of the compiled code, rather than dynamically determined at runtime according to instruction scheduling/thread prioritization. Notably however, such techniques assume the presence of a centralized task scheduler; in other words, the software designer has written the software such that a centralized scheduler executes the threads in the intended (structured) order.

As previously alluded to, neural networking loosely models the neuro-biological functionality found in the human brain. In biological systems, each neuron operates independently of other neurons without a centralized management functionality or sequence of execution. Thus, neural networks are particularly well represented by asynchronous thread dependency graphs, e.g., each node may correspond to one or more thread(s). Various embodiments of the present disclosure use thread dependency graph analysis to decouple scheduling across many distributed cores when compiling a neural network model into hardware description language and/or software executables. In other words, rather than using thread dependency graphs to generate a sequential ordering for a centralized scheduler that is evaluated at "run-time", the individual thread dependencies define a count value for each thread at "compile-time." Threads and their thread dependency count are distributed to each core at "program-time". In this manner, each core can configure its dedicated control path logic for independent operation. As shown in FIG. 5, cores 0 and 1 have instructions and initial scoreboard values for each of their constituent threads. Thereafter, each core can dynamically determine which threads to execute based on fulfilled thread dependencies without requiring a centralized scheduler.

In one exemplary embodiment, threads are not structurally ordered, instead each core dynamically queues threads at runtime when the thread's dependencies are satisfied. In one such variant, each thread is permanently placed within a single core for the lifetime of the program. The set of threads placed in each core is called a thread pool. Threads in the same thread pool within one core share the same memory resources; for example, threads 502A, 504A, 506A and 508A may freely share data. To share data between different thread pools (between different cores), explicit inter-core communications are required (e.g., thread 508A does not share data with thread 502B, even though thread 502B depends on thread 508A). While the exemplary embodiments described herein permanently place threads and thread pools to cores, alternative implementations may allow e.g., cross-scheduling and execution of threads, and/or resource sharing across different cores. For example, a thread may be suspended and migrated to a different core, etc. Various other implementations may be substituted by artisans of ordinary skill in the related arts, given the contents of the present disclosure.

In one exemplary embodiment, each thread in the thread pool may change the scoreboard's state. More directly, a first thread may produce data for a second thread and then decrement the second thread's score to move it closer to execution. Unlike existing techniques that rely on a centralized task scheduler, the exemplary scoreboard enables thread scheduling in a distributed manner. In other words, each core's threads may be dynamically increased or decreased by the ongoing threads (both within the core, and external to the core). More directly, task scheduling is incorporated within the threads themselves, rather than as a task scheduling process. Furthermore, the exemplary mechanism described herein is embodied as hardware logic (the scoreboard 402), rather than instructions which are executed by a processor (a software-based process.) Hardware logic requires substantially less compute overhead and latency and can be implemented within embedded devices (low power, resource limited platforms.)

In the aforementioned embodiment, threads and thread pools share resources of the core and are limited to cross-thread management within the same thread pool. To facilitate cross-thread management for different cores ("inter-core thread management"), an asynchronous handshake protocol enables access to scoreboards in the destination cores. Consider one such exemplary communication sequence depicted in FIG. 5; ideally, both the sending thread 508A and a receiving thread 502B are ready to communicate before inter-core data transmission begins. Without a guarantee that thread 502B is ready to receive data, thread 508A should not send anything over the routing network because it may impede other inter-core communications. Similarly, the receiving thread 502B should not consume its core's shared resources while it waits for the sending thread 508A.

In one exemplary embodiment, if the sending thread 508A has data to send before recipient thread 502B is ready, then it goes to sleep. The recipient thread 502B sends a notification to the sending thread 508A, that the recipient thread 502B is ready to receive data and then goes to sleep. The ready message travels over the interconnecting network of router nodes and decrements the sending thread's score. When the sending thread 508A wakes up and resumes operation, it starts streaming the data over the interconnecting network of router nodes to the destination core's router I/O which stores the data into the destination core's shared memory. When the stream has been completely transmitted, the sending thread 508A decrements the recipient thread's score. The recipient thread 502B can wake and retrieve the data from the shared memory.

Example Operation

FIGS. 6A-6F provide a step through of an exemplary core's control and data path operations corresponding to the core 0 thread pool operations of FIG. 5. While the following discussion is presented in the context of single cycle pipelined instructions for ease and clarity of illustration, the concepts described herein may be broadly extended to multi-cycle instructions that are fully, partially, or not-at-all pipelined. Additionally, the exemplary cores may have many thread pools (not shown) in concurrent operation; the following logical eye diagrams provide labeled "open eyes" to identify known logic states for the exemplary thread pool, and "closed eyes" to indicate don't care states (where the core may be idle or executing other threads).

Figure 6A:
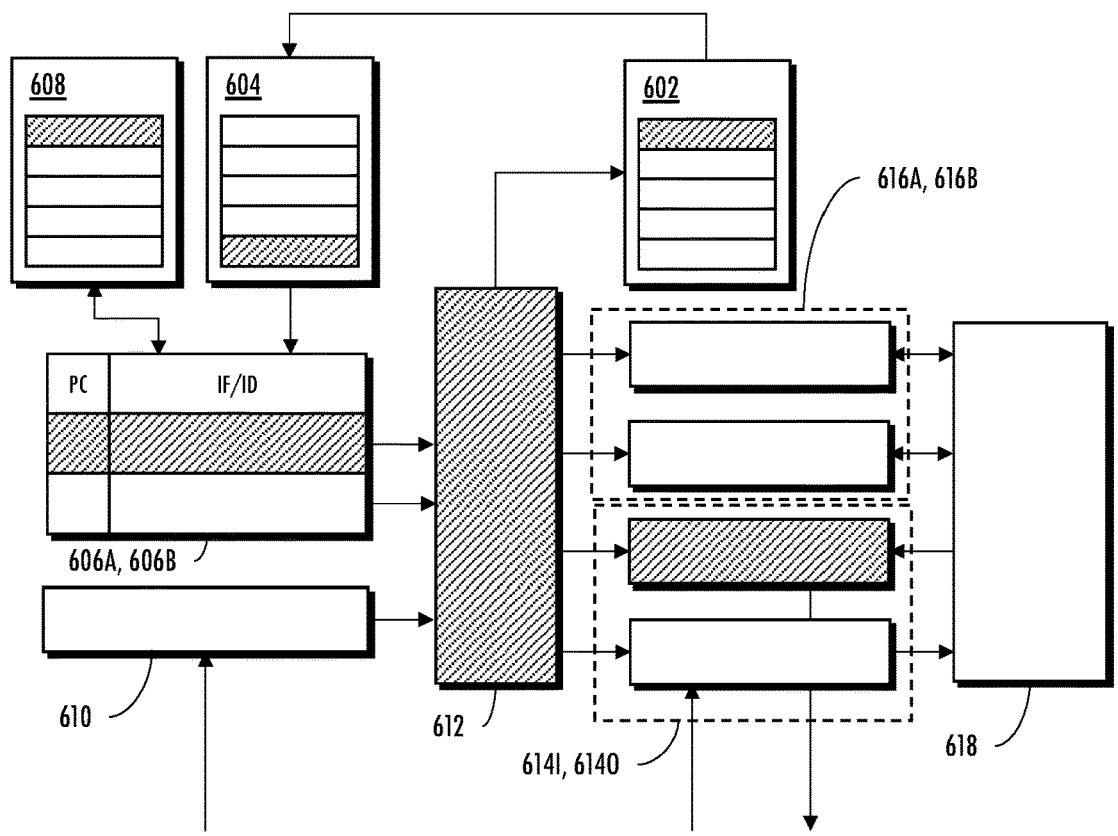
FIGS. 6A-6F are graphical representations of an exemplary core's control and data path operations, in accordance with the principles described herein.
Figure 6A:
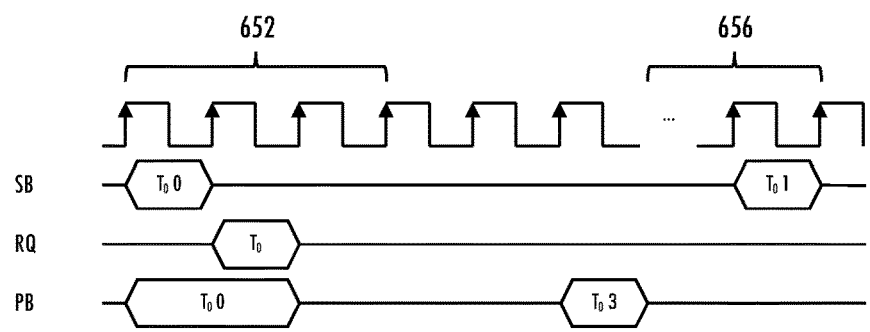
Figure 6A:
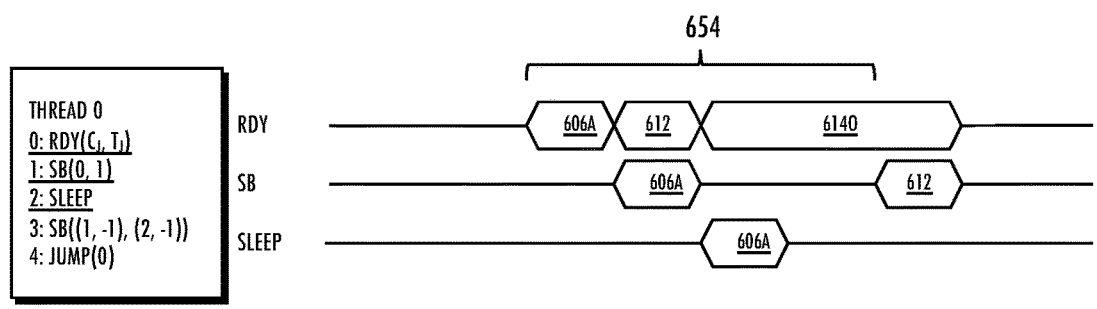

Referring first to FIG. 6A, a first set of transactions 652 illustrate how the exemplary scoreboard controls multi-threaded operation using thread dependencies. In this example, the scoreboard values are initialized to:

$$\begin{bmatrix} \text{thread 0} \\ \text{thread 1} \\ \text{thread 2} \\ \text{thread 3} \end{bmatrix} = \begin{bmatrix} 0 \\ 1 \\ 1 \\ 3 \end{bmatrix}$$

In this thread pool, only thread 0 is ready for execution; thus, thread 0 enters the ready queue 604 in the second clock cycle and is assigned to an open lane 606A of the IF/ID starting at instruction 0 in the third cycle. Lane 606A reads the thread instructions and provides them to the issue controller 612 for issuance.

Transactions 654 depict to a multi-cycle asynchronous RDY handshake with another thread of another core (core $C_j$, thread $T_j$) to solicit new input data. Since the data transfer is likely to take a long time, thread 0 immediately goes to sleep (SLEEP) by writing its current instruction state (3) in the program buffer (PB) 608. In this case, the sleep instruction (SLEEP) occurs before the other in-flight instructions (RDY, SB) have completed.

In transactions 656, the issue controller 612 continues to monitor and manage its in-flight instructions for lane 606A. For instance, the issue controller queues a scoreboard write instruction (SB) to occur after the router output 414O completes its RDY handshake; once the RDY handshake is complete, the SB instruction increments the scoreboard value of thread 0 by 1. At this time, the scoreboard values for this thread pool are:

$$\begin{bmatrix} \text{thread 0} \\ \text{thread 1} \\ \text{thread 2} \\ \text{thread 3} \end{bmatrix} = \begin{bmatrix} 0 \\ 1 \\ 1 \\ 3 \end{bmatrix}$$

Figure 6B:
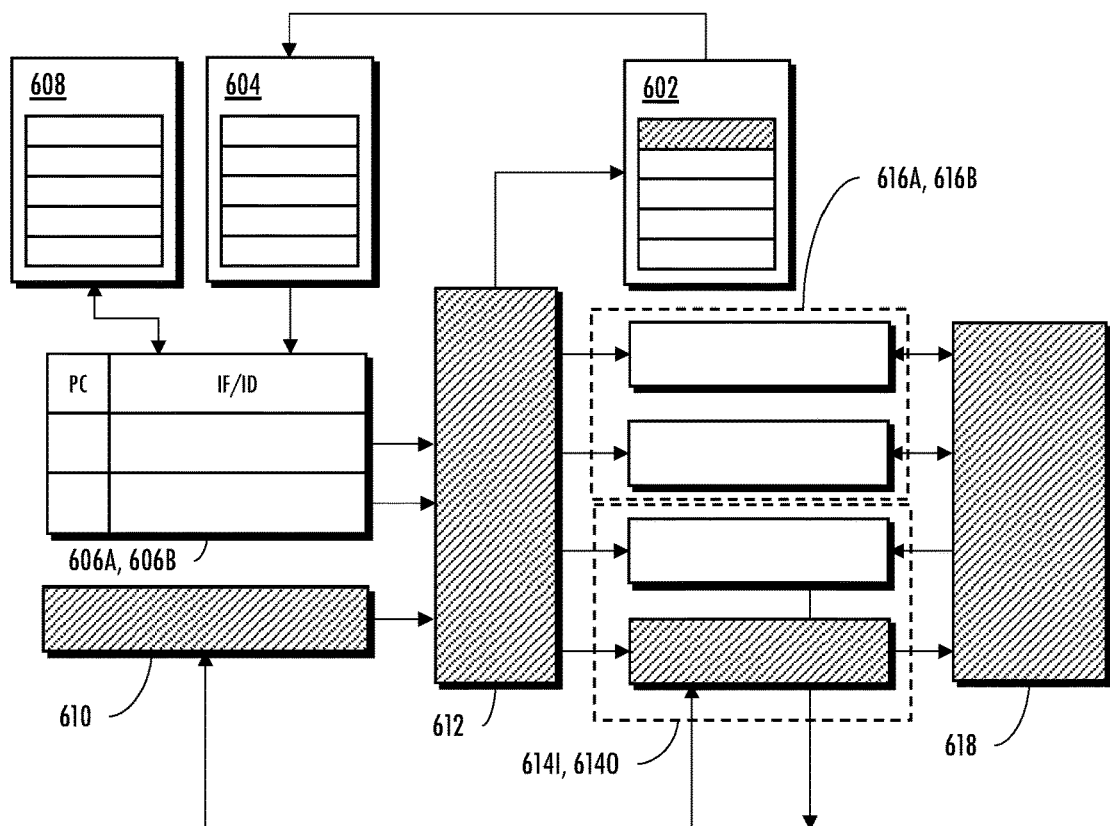
Figure 6B:
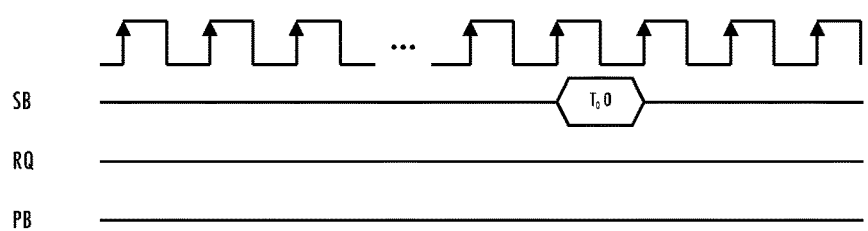
Figure 6B:
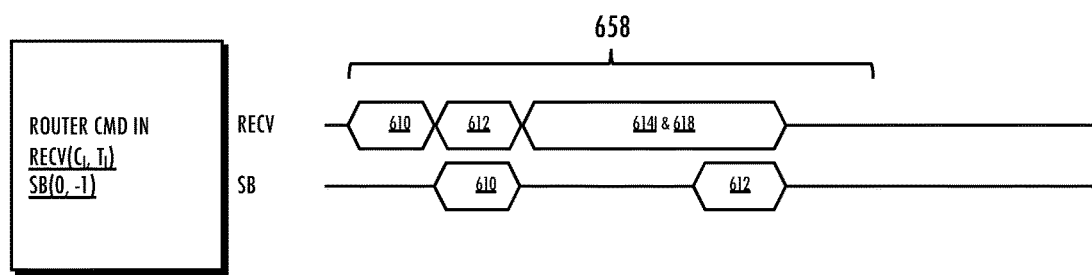
Figure 6C:
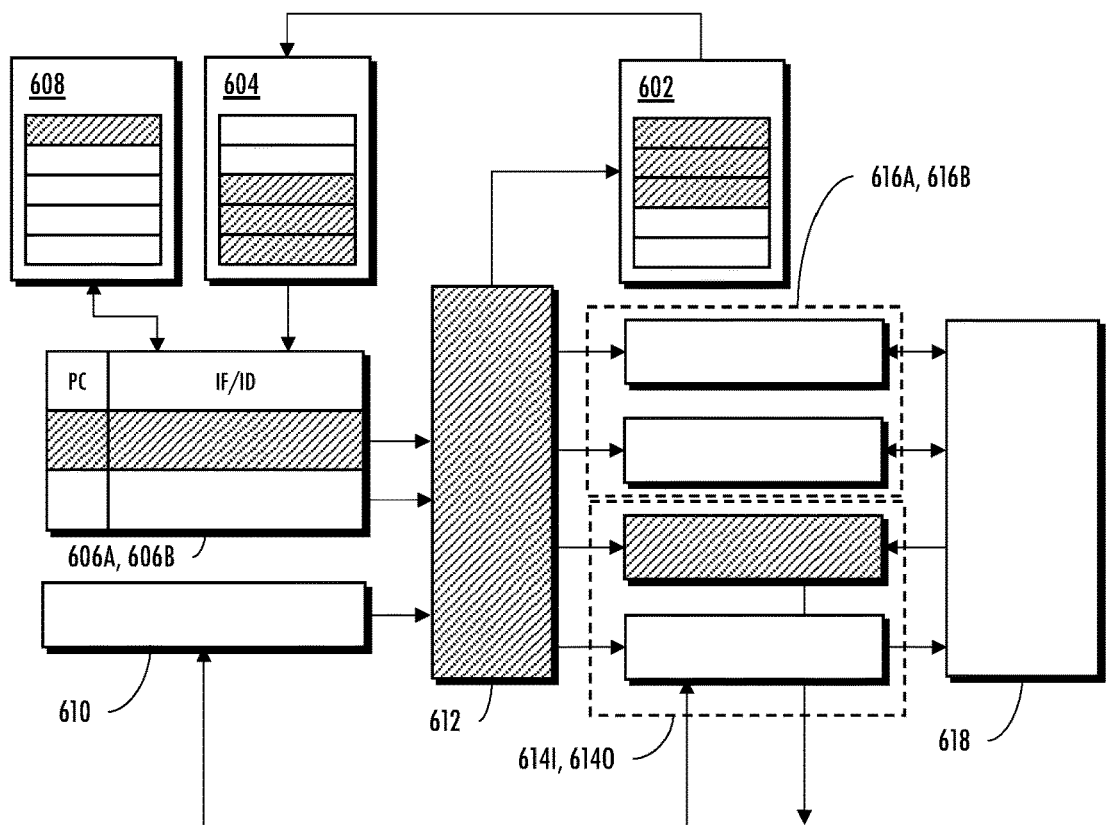
Figure 6C:
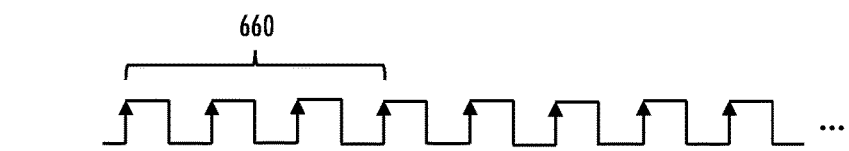
Figure 6C:
Figure 6C:
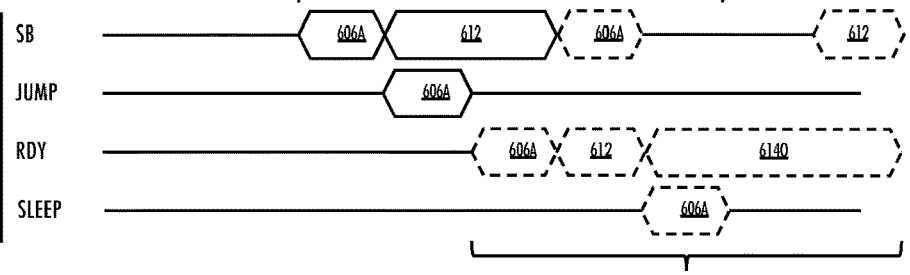

Even though core 0's own thread pool is inactive, external thread dependencies can affect core 0's operation. Referring now to transactions 658 of FIG. 6B, core $C_j$ thread $T_j$ responds to core 0's RDY handshake. As shown in FIG. 6B, external control path communications are received via the router command input 610. In the illustrated embodiment, the external control path may enable direct access to the issue controller 612. In other implementations, the external control path may trigger execution of a special-purpose inter-core thread that implement core-to-core specific functionality. For example, core-to-core communication may need to be authenticated, encrypted/de-crypted, verified, validated, or otherwise checked before execution. In other such examples, the special-purpose thread may handle core-specific optimizations; for example, the thread may wake-up, initialize, and/or warm-up portions of the core. This may be particularly useful for devices with multiple power management states (low power, light sleep, deep sleep, etc.) Still other variants may be substituted by artisans of ordinary skill in the related arts, given the contents of the present disclosure.

Referring back to transactions 658, core $C_j$ thread $T_j$ writes data into the shared resource 618 via router input 614I. The issue controller 612 monitors the multi-cycle transaction between the shared resource 618 and the router input 614I and issues a scoreboard update to thread 0 when the input data is fully received. At this point, the scoreboard values are:

$$\begin{bmatrix} \text{thread 0} \\ \text{thread 1} \\ \text{thread 2} \\ \text{thread 3} \end{bmatrix} = \begin{bmatrix} 0 \\ 1 \\ 1 \\ 3 \end{bmatrix}$$

Based on its thread dependency count, thread 0 can enter the ready queue (RQ) to resume operation. Once again, thread 0 is assigned to the first open lane which is IF/ID lane 606A (transaction 660 of FIG. 6C). Thread 0's next operations are to: (i) decrement the scoreboard for both thread 1 and thread 2 (transaction 662 of FIG. 6C), and (ii) jump back to wait for more input data (dashed transaction 664 mirrors the earlier transaction 654). At the conclusion of transaction 662, the scoreboard is:

$$\begin{bmatrix} \text{thread 0} \\ \text{thread 1} \\ \text{thread 2} \\ \text{thread 3} \end{bmatrix} = \begin{bmatrix} 0 \\ 0 \\ 0 \\ 3 \end{bmatrix}$$

Figure 6D:
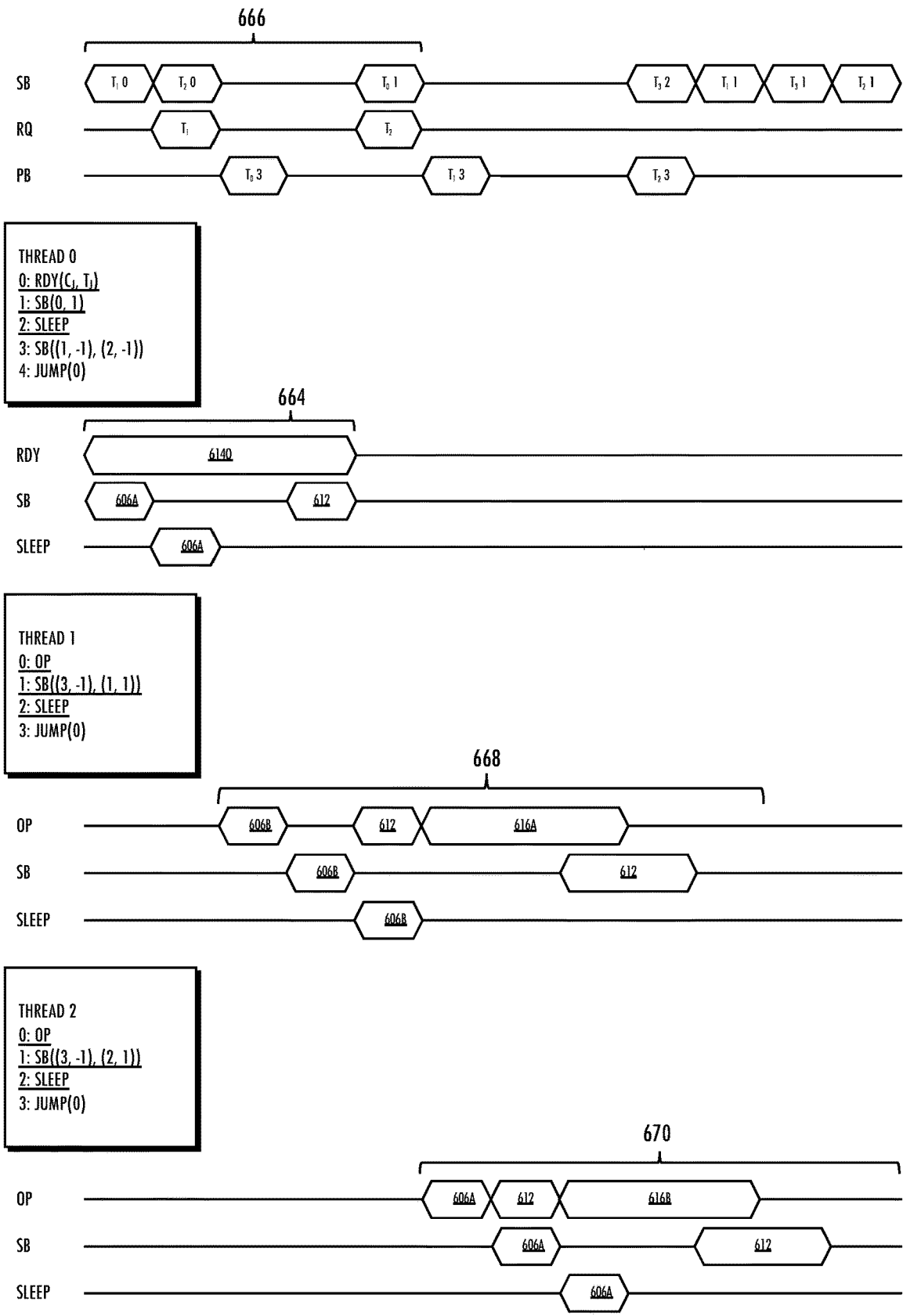

FIG. 6D presents eye diagram representations of concurrent execution of thread 0, thread 1, and thread 2, in view of the scoreboard (SB) 602, ready queue (RQ) 604, and program buffer (PB) 608 contents. As shown in FIG. 6D (and also previously noted in FIG. 6C), IF/ID lane 606A is executing thread 0; thread 0 has jumped back to wait for more data (transactions 664). At the same time, while thread 1 and thread 2 both have a thread dependency count of 0, only lane 606B is available. Consequently, thread 1 immediately enters the IF/ID, however thread 2 must wait in the ready queue (RQ) until a lane opens up (transactions 666). In this case, when thread 0 completes (end of transactions 664) it goes to sleep which frees IF/ID lane 606A for thread 2 (end of transactions 666).

As shown in transactions 668, thread 1 is assigned to IF/ID lane 606B. Notably, the issue controller 612 is initially occupied with other tasks (the SB instruction of thread 0) so thread 1's operation (OP) is delayed in-queue before being issued to the first available execution unit (execution unit 616A). The issue controller 612 monitors progress of the execution unit 616A and performs two SB updates thereafter (decrementing thread 3's thread dependency by 1 and incrementing its own thread dependency count by 1.) As previously noted, thread 1 is allowed to sleep as soon as its instructions are in-flight.

Referring now to transactions 670, thread 2 is assigned to the next available IF/ID lane (lane 606A) and the next available execution unit (execution unit 616B). As with thread 1, the issue controller 612 monitors progress of the execution unit 616B and performs two SB updates thereafter (decrementing thread 3's thread dependency by 1 and incrementing its own thread dependency count by 1.) Thread 2 is also allowed to sleep as soon as its instructions are in-flight. At the conclusion of transaction 670, the core can switch to other tasks or it can drop into a low power state because there are no threads waiting in the ready queue (RQ). In summary, the scoreboard at this point is:

$$\begin{bmatrix} \text{thread 0} \\ \text{thread 1} \\ \text{thread 2} \\ \text{thread 3} \end{bmatrix} = \begin{bmatrix} 1 \\ 1 \\ 1 \\ 1 \end{bmatrix}$$

Figure 6E:
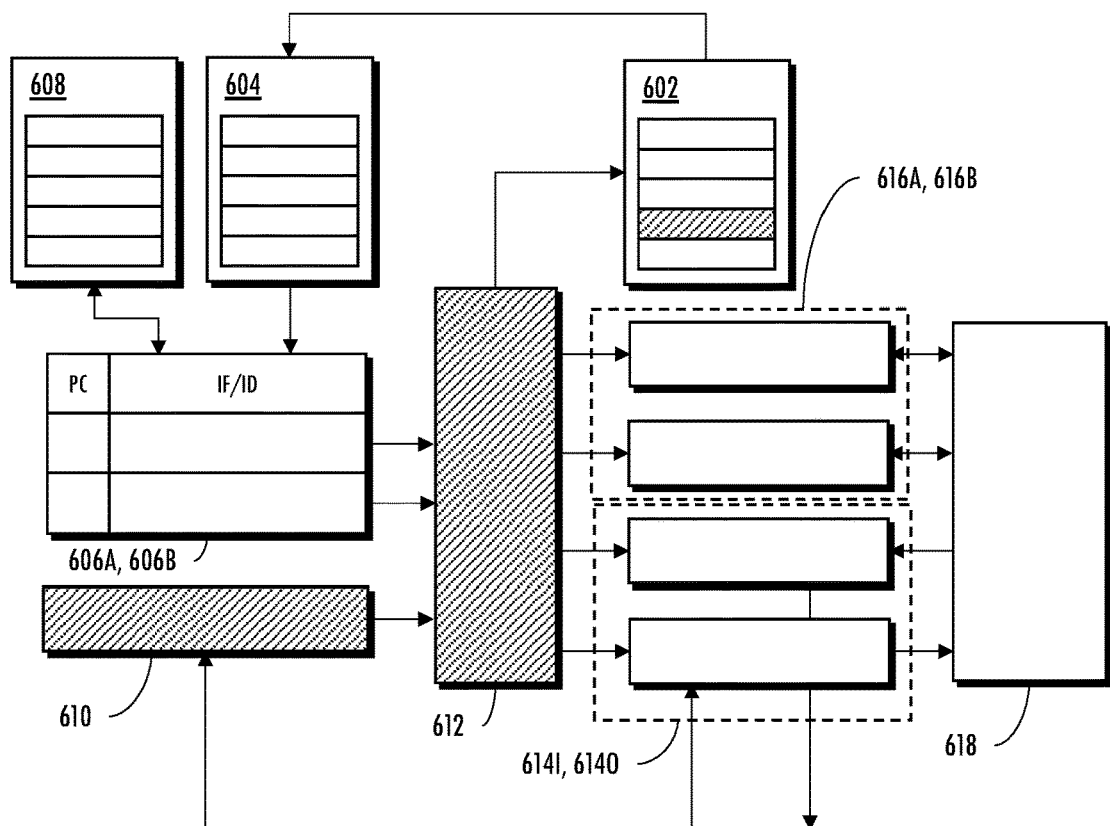
Figure 6E:
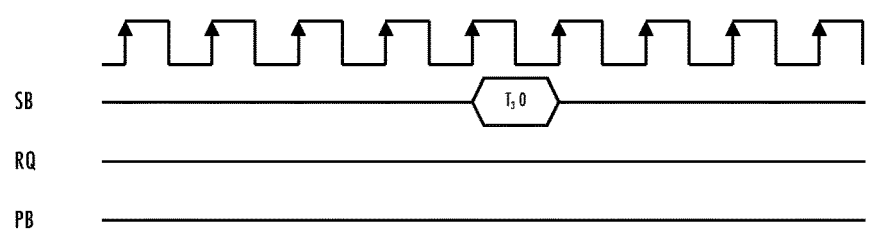
Figure 6E:
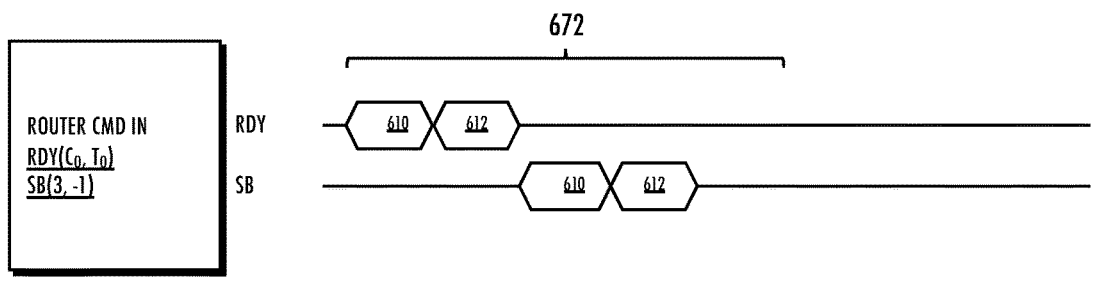

At a later point, another thread of another core can request the calculated data from core 0 by issuing a RDY instruction and decrementing thread 3's thread dependency count (FIG. 6E, transactions 672). The scoreboard at this point is:

$$\begin{bmatrix} \text{thread 0} \\ \text{thread 1} \\ \text{thread 2} \\ \text{thread 3} \end{bmatrix} = \begin{bmatrix} 1 \\ 1 \\ 1 \\ 0 \end{bmatrix}$$

Figure 6F:
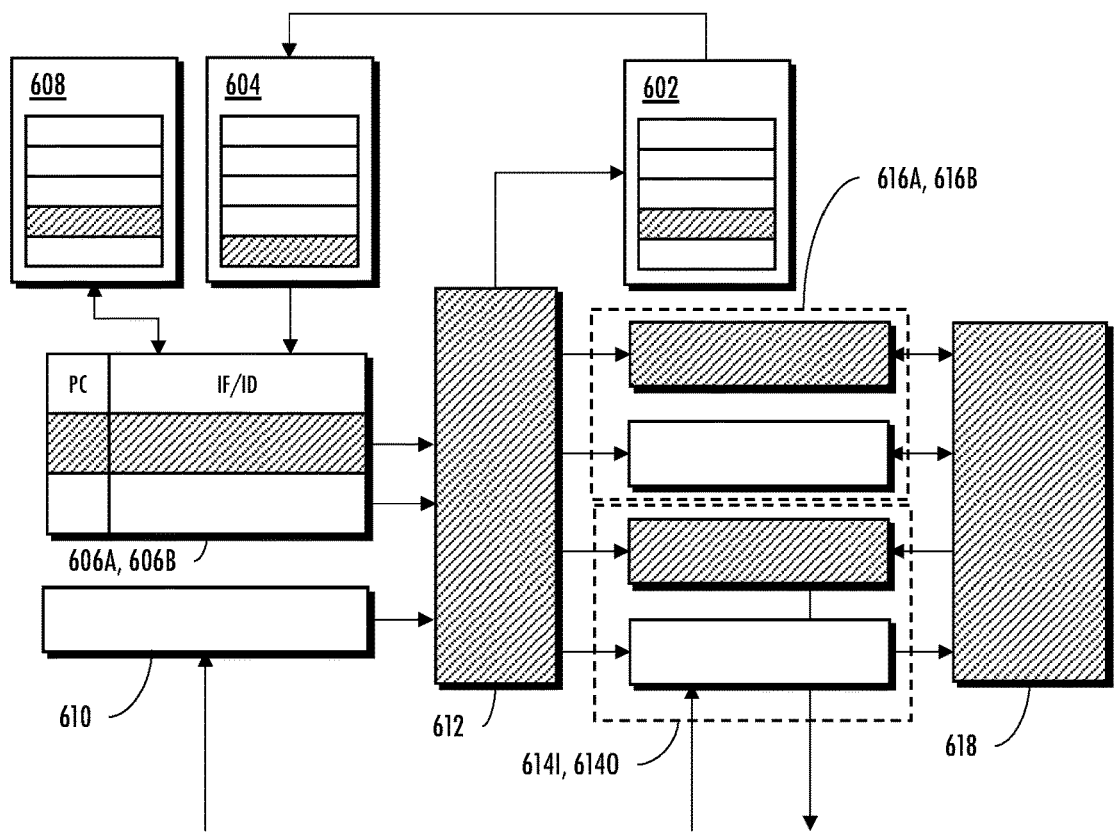
Figure 6F:
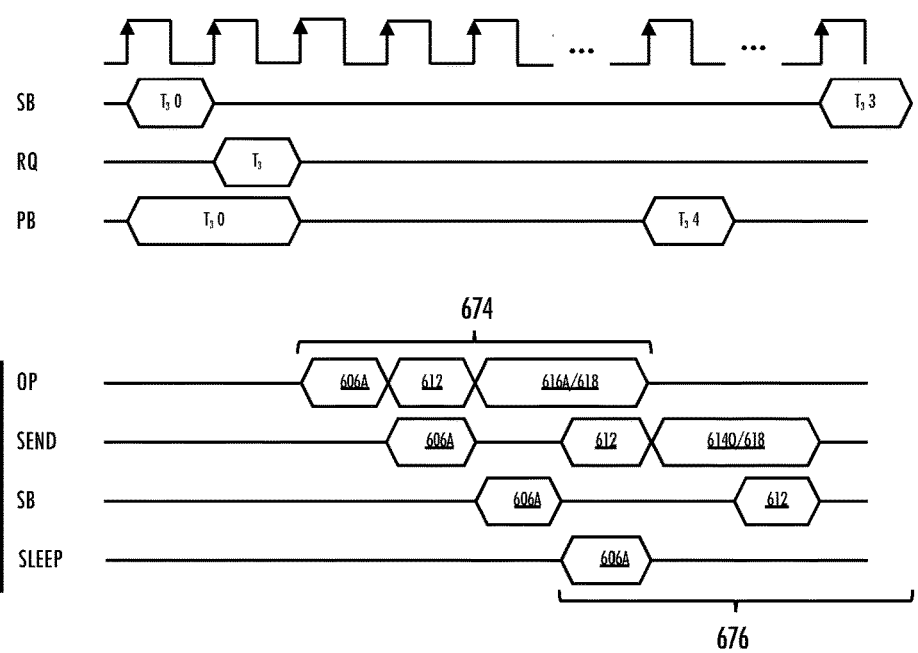

In FIG. 6F, the core 0 thread 3 is assigned to the first available IF/ID lane (lane 606A). The issue controller 612 assigns the first available execution unit (execution unit 616A) to perform an arithmetic operation (OP) on the shared resource 618 (transactions 674). The issue controller 612 monitors the OP progress; when OP completes, the issue controller sends the data in the shared resource 618 via the router I/O (614O) and updates its scoreboard (transactions 676):

$$\begin{bmatrix} \text{thread 0} \\ \text{thread 1} \\ \text{thread 2} \\ \text{thread 3} \end{bmatrix} = \begin{bmatrix} 1 \\ 1 \\ 1 \\ 3 \end{bmatrix}$$

As can be appreciated from the foregoing discussion of FIGS. 6A-6F, managing thread dependencies using the core's dedicated control path data structures (scoreboard 602, ready queue 604, and program buffers 608) ensures that each core can asynchronously and independently manage its own instruction execution without centralized task scheduling. The control path logic only queues threads that have satisfied their thread dependencies. Since the thread dependency counts were determined from the logical structure of the thread graph at compile-time, the control path logic implicitly (structurally) prevents run-time hazards without incurring additional scheduling overhead.

Methods

Figure 7:
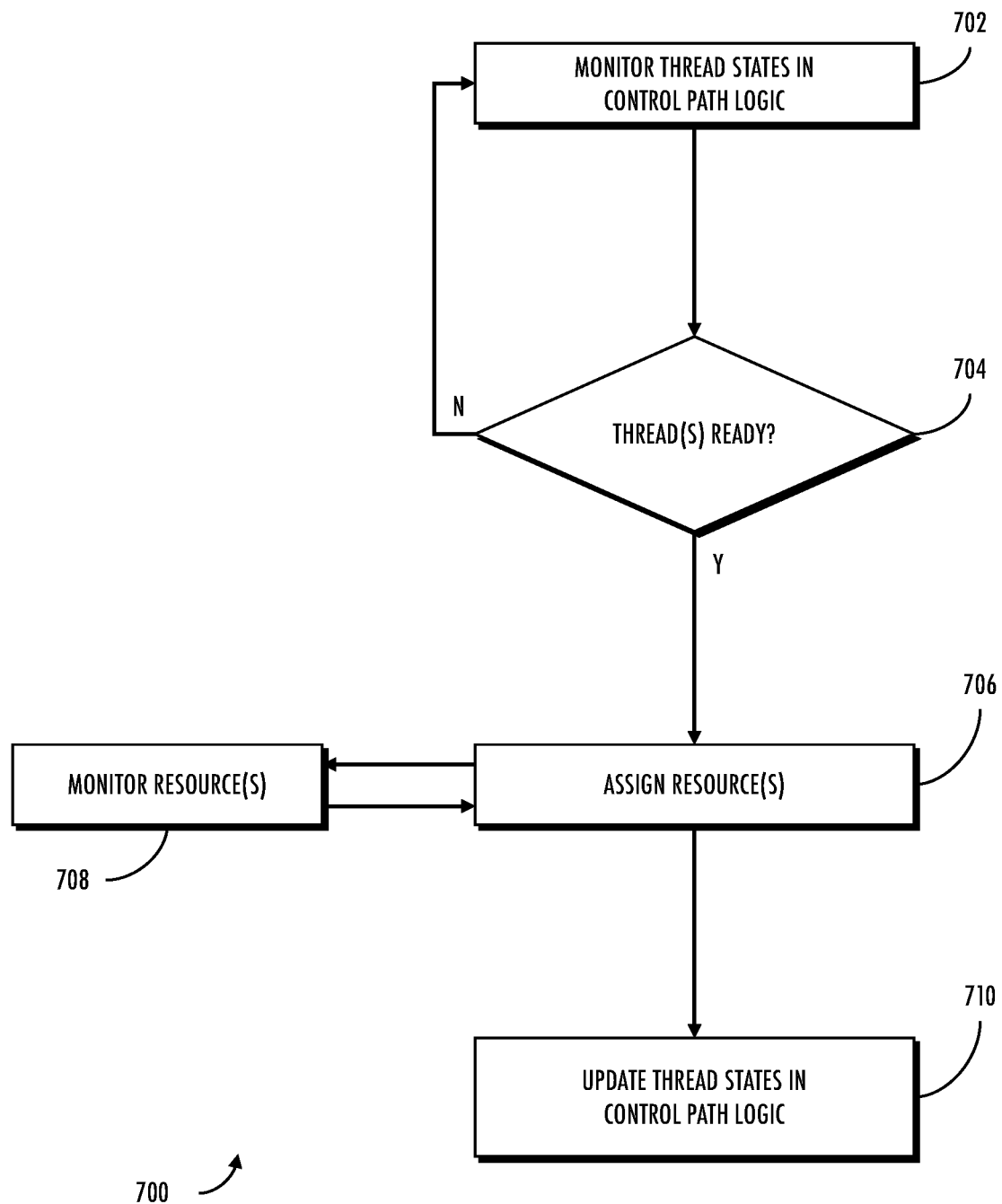
FIG. 7 is a logical flow diagram of a generalized method for thread-based scheduling, in accordance with the principles described herein.

Referring now to FIG. 7, one logical flow diagram of a generalized method 700 for thread-based scheduling is shown. The generalized method may be executed by a core of a multicore processor (such as cores of FIG. 4 and FIGS. 6A-6F) that includes dedicated control path logic for managing threads e.g., a scoreboard, a ready queue, and a program buffer. In the exemplary implementation, the scoreboard indicates which threads have satisfied their thread dependency counts and can be queued for execution, the ready queue orders the threads for execution, and the program buffer identifies the current/next instruction for each thread.

At step 702, thread states are monitored in control path logic. In one aspect, the control path logic is dedicated for thread control. As a brief aside, the "control path" refers to logic and/or functionality that affects the sequence of operations that are performed and/or that are fetched to be performed ("in-flight" instructions). Typical examples of control path operations include without limitation: jumping, branching, and/or conditional execution. The "data path" refers to logic and/or functionality that manipulate addressable data. As a practical matter, addressable data is shared across multiple threads and/or cores; thus, run-time data path dependencies may result in data access hazards. Notably, some control path operations may share the data path resources and/or vice versa; for example, control path instructions may use "intermediate" values that are stored in addressable data (e.g., intermediate format, or I-format). However, other control path operations have dedicated logic that is outside of the data path; for example, internal processor registers are not addressable via the address bus (e.g., so-called register format, or R-format instructions).

One salient advantage of using dedicated control path logic for managing thread execution is that it ensures that each core can determine which thread to execute next without blocking other threads' and/or cores' access to resources (e.g., a shared memory). More generally, however, any scheme for allowing nodes to independently and/or asynchronously operate within a neural network may be substituted with equal success. For example, hardware implementations of a neural network may utilize control logic circuitry to ensure that node dependencies are preserved (using gated enable/disable logic to control the data path, rather than sequencing thread execution). Similarly, software implementations of a neural network may utilize logical semaphores and/or other data structures (e.g., signaling protocols, handshaking mechanisms, etc.)

In one aspect, the control path logic is determined at compile-time. For example, neural network software may use threads to describe the functionality of each node of the network. The compiler generates a thread dependency graph by identifying data dependencies between threads and translates the functionality of each node into machine code (opcodes) at "compile-time." Once compiled, the instructions and thread dependency counts may be stored into a non-transitory computer readable medium for a processor core to execute during "run-time" execution.

By direct extension, artisans of ordinary skill in the related arts given the contents of the present disclosure will readily appreciate that the techniques described herein are broadly applicable to any form of hardware and/or circuit logic that can benefit from structured data dependency avoidance at compile-time (versus checking data dependency at run-time). Notably, a field-programmable gate array (FPGA) implements hardware description language (HDL) within look-up-tables (LUTs) and sequential logic (registers); application specific integrated circuits (ASICs) implement HDL within combinatorial gates (AND, OR, NAND, NOR, etc.) and sequential logic. While FPGAs and ASICs may be flexibly designed to handle large data busses, this takes more silicon real estate and incurs proportional increases in power-consumption and performance penalties for each bit of data. Consequently, compiling nodes to structurally avoid data dependencies reduces both the amount and complexity of the resulting network.

Various embodiments of the present disclosure monitor a thread state. In one embodiment, thread state corresponds to a count of thread dependencies. As a brief aside, a "thread" is the smallest discrete unit of processor utilization that may be scheduled for a core to execute. A thread is characterized by: (i) a set of instructions that is executed by a processor, (ii) a program counter that identifies the current point of execution for the thread, (iii) a stack data structure that temporarily stores thread data, and (iv) registers for storing arguments of opcode execution. A "single-threaded" application consists of only one thread whereas a "multi-threaded" application may have a distinct program counter, stack, and set of registers for each thread. In some variants, the multi-threaded application may share resources (e.g., a common code base, memory resource, etc.) In other variants, one or more threads of the multi-threaded application may have dedicated resources.

As used herein, the terms "state" and/or "stateful" refer to thread management techniques that maintain an ongoing status to execute a transition; a transition is a set of actions to be executed when a condition is satisfied and/or event occurs. Stateful thread management implements control path logic within the core itself to track each thread's state (i.e., without relying on centralized task scheduling software).

In one embodiment, thread state may include the thread dependencies that are necessary to unblock execution. As used herein, a thread is "blocking" (or "blocks" other threads) when its execution causes a hazard for at least one other thread (its thread dependencies). Common examples of hazards include data hazards, structural hazards, and control hazards. Hazards are well understood by artisans of ordinary skill in the computing arts and not further discussed herein. An "unblocked" thread has no current dependencies, i.e., its thread dependencies (if any) have been satisfied.

In one embodiment, thread state may include the execution progress of a currently blocked thread. In one such implementation, a program buffer may store the next (or current) instruction in the thread. Other types of execution progress that may be stored may include e.g., register contents, operands, wake-up interval/sleep-duration, and/or any other thread-specific information. While the foregoing examples are presented in the context of a thread that is blocked by a data dependency, artisans of ordinary skill in the related arts given the contents of the present disclosure will readily appreciate that a variety of other dependencies may affect thread state. For example, thread state may be based on resource and/or environmental dependencies. As but one such example, a thread may be "woken" when a sensor detects activity of interest (e.g., a triggering sound, image, etc.) In other examples, a thread may sleep when resources (processing cycles, memory, network bandwidth, hardware logic, etc.) are unavailable, and wake-up when the resource is free. Still other implementations may hierarchically enable networks of increasing complexity based on stimulus dependencies; for example, a short stimulus (e.g., a "wake word") may only excite a few threads, more complex stimulus (e.g., a spoken sentence) may trigger a larger neural network with commensurately more threads. Other implementations may be substituted with equal success.

While each core operates independently of other cores, the techniques described herein enable threads within each core to affect the thread state of other threads in other cores. The lack of centralized management and highly flexible connectivity means that the thread state of a core's threads may change without any of the core's own activity. In one embodiment, each core independently monitors its threads to identify threads that are ready for execution. In other embodiments, a core may be notified of changes to its thread states. For example, an external thread (running in another core) may change the scoreboard for a core's internal threads. The external thread may additionally flag the state change to the core. In this manner, the core may only infrequently need to be checked. More generally, a core may monitor threads continuously, periodically, when instructed to do so, on an as-needed basis (e.g., when an IF/ID lane, or other processing resource frees up), or any other frequency.

More broadly, various aspects of the present disclosure are directed to wait-free access to thread state for multiple concurrently operating threads. Here, "wait-free" refers to non-blocking access on a per-thread basis. While the foregoing discussion is presented in the context of control path logic for a core of a multicore architecture, the techniques broadly enable many different architectures to perform multi-threaded operations without fear of hazards; this functionality is particularly useful for asynchronous (no shared time reference) and independent (no centralized coordination) parallel processing. The techniques described herein may be extended for a network of processing cores that are separated from one another, potentially by substantial distance or time. For example, a large neural network may be split into thread pools for distribution within a server farm or potentially even across wired/wireless networks. In other examples, a neural network may do computations in idle time (e.g., unpredictable gaps of time between thread executions). In other words, by de-coupling threads and implementing a wait-free queuing system, any number of nodes may be implemented subject only to time, power and/or memory constraints.

While the present disclosure uses dedicated control path logic (e.g., registers and/or combinatorial logic in a processing core), any technique for wait-free monitoring of thread state may be substituted with equal success. For example, more complex implementations may use a distributed scoreboard that is accessible from multiple machines and locally cached. The locally cached scoreboard may be updated by each machine as their threads complete; when the locally cached scoreboard needs to update other threads, the updates may be transferred out. While this scheme is substantially more complex than the dedicated control path logic implementation, artisans of ordinary skill given the contents of the present disclosure will readily appreciate that it could provide wait-free access on a substantially larger scale. This may be useful for other applications (e.g., very large neural networks that have relaxed time constraints, etc.)

Referring back to FIG. 7, when a thread state is ready for execution, the thread is assigned resources (steps 704 and 706). In some implementations, resource utilization is monitored and assigned when available (step 708).

In one aspect, the unblocked threads are assigned a priority of execution based on their order in a ready queue. In one exemplary embodiment, the next ready thread is assigned to the first available instruction fetch/instruction decode (IF/ID) lane. The IF/ID lane resumes thread operation at the next instruction (based on thread state information stored within the program buffer). In one specific implementation, the thread's IF/ID lane assignment persists until the thread suspends itself. In other implementations, the thread's IF/ID lane assignment may be released or revoked; for example, the issue controller may revoke the lane assignment if the thread's resources are unavailable, similarly, the thread's instructions may be structured as branch statements (e.g., if resource is available issue, otherwise suspend). Still other techniques common in the processing arts may be substituted with equal success.

While the foregoing discussion is presented in the context of a first-come-first-served basis (e.g., a first-in-first-out (FIFO) queue), other priority schemes and ready queues may be used with equal success. As but one such example, the ready queue may be implemented as a last-in-first-out (LIFO), or first-in-last-out (FILO), ready queue. Certain types of threaded operations may be more efficiently handled with a LIFO stack; for example, pushing a thread into the LIFO ready queue ensures that all subsequent threads will be handled first (e.g., at a higher priority). In still other implementations, the ready queue may be prioritized or re-ordered; for example, certain threads may be prioritized for execution as soon as they are unblocked and/or de-prioritized to execute when there are no other un-blocked threads ("best effort" execution). Other prioritization techniques may offer fairness or load balancing; examples of queuing techniques include, without limitation: round robin, weighted round robin, water-filling, etc.

In another aspect, thread instructions may be assigned processing resources. In one specific implementation, the issue controller tracks the utilization of the processor core's resources, e.g., the execution units during multi-cycle data manipulations and router input/output (I/O) during data transfers. In some embodiments, instructions are assigned to processor resources on a first-come-first-served basis. Other schemes may be also be used; for example, resources may be assigned to keep one execution unit fully loaded, and another execution lightly loaded (if at all). This may be beneficial from power consumption standpoints. Still other embodiments may load balance to maximize overall device performance.

While the foregoing examples are presented in the context of symmetric processing resources, asymmetric capabilities of different processing resources may also be considered by the issue controller. For example, certain execution units may be better suited to low power operation (e.g., lower clock rates, reduced width data busses, etc.) whereas other units may be high performance (e.g., higher clock rates, wider data busses, etc.) Similarly, while the foregoing scheme is presented in the context of a broadcast-based router input/output, other implementations may use multi-cast and/or unicast router I/Os. This may be preferable for operations and/or communications that have benefit from high bandwidth and/or low fan-out.

It is appreciated that most neural networking applications operate within the context of a broader system, thus a variety of different resources may be assigned by an issue controller. Examples of such resources include, without limitation: encryption/decryption engines, security modules (authentication, authorization, ciphering, etc.), encoding/decoding (codec) for audio and/or visual media, digital signal processing (DSP), and/or any variation of dedicated arithmetic operations. As but one such example, a natural language processing machine learning application may use code-excited linear prediction (CELP) resources to perform speech coding, which is then processed within a neural network pool. In some cases, the natural language processing may additionally be obfuscated or otherwise encrypted to prevent unintended data leakage (or other security and privacy breaches). As another such example, a multicore network that spans multiple devices may need to incorporate secure communication to ensure that the communications are not maliciously attacked or snooped in transit.

Artisans of ordinary skill in the related arts will readily appreciate that resource assignments may be based on factors other than resource utilization. Other considerations may include e.g., application-specific considerations (e.g., latency, throughput, accuracy, robustness, power consumption, etc.), device-specific limitations (e.g., processing cycles, memory space, network bandwidth, power and/or clock limitations, etc.), etc. For example, cloud-based neural networks have access to nearly infinite cloud compute resources however compute time may be charged on thread utilization; in such cases, threads may be compiled at compile-time to reduce overall thread utilization (e.g., collapsing multiple related threads into a single thread, etc.) In another such example, time insensitive applications may have a limitless time budget for the neural network and should be preferably performed on idle resources. In such cases, threads may be compiled at compile-time to support a wide gamut of potential processing resources.

In some cases, thread execution may consume a resource for multiple cycles; thus, thread execution within the assigned resources may be monitored for completion (step 708). Yet other implementations may have a known or deterministic cycle time; for example, an instruction or resource may specify that execution will complete within a number of cycles, a length of time, etc. Other implementations may use completion signaling or other protocol to notify the issue controller when the execution is complete; such techniques are typically used where the utilization is indeterminate and/or indeterminable by the core. For example, a handshake protocol can be used to indicate when a router transaction is complete. More broadly, artisans of ordinary skill in the related arts will readily appreciate that execution progress is monitored to avoid potentially blocking behavior (e.g., multiple instructions that would attempt to access the same execution unit, shared resource, etc.) In other words, the issue controller can monitor resource utilization to prevent resource hazards.

In other cases, resources may be single-cycled, non-branching, or otherwise amenable to feed-forward pipelining; the issue controller can "fire-and-forget" in such implementations. For instance, the illustrative examples described above describe sleep instructions that write the current thread pointer to a program buffer and set a thread dependency count for the thread in the scoreboard. Pipelined operation generally improves processor performance and/or reduces overall system latency.

Finally, thread states are updated in control path logic (step 710). In one embodiment, a thread updates its own thread state or a thread state of a thread in its thread pool. In some such variants, the thread state updates may occur synchronously via an executed instruction. In other embodiments, a thread may update other thread states in other thread pools, cores, devices, or even multicore networks. In some such variants, the thread state updates may occur asynchronously via an a multi-cycle handshake or similar asynchronous signaling protocol.

Notably, various embodiments described herein implement a machine language instruction ("opcode") that updates a thread dependency count in accordance with a thread dependency graph determined by the compiler. More broadly, various aspects of the present disclosure are directed to a compiler generated instruction that updates thread states in accordance with a thread state graph that is not determined at run-time. As used herein, the term "graph" refers to a logical structure that is comprised of vertices (or nodes) and edges (links). Edges may be directional or direction-less. Graph analysis structurally constrains thread execution because a thread may only execute when its dependencies have been satisfied. Graph analysis greatly reduces the complexity of thread scheduling and allows for distributed scheduling across a network of independent nodes. While the exemplary embodiments are described with respect to a scoreboard-based thread queuing, artisans of ordinary skill in the related arts will readily appreciate that any implementation of a structural graph may be used to control thread execution. As but one such example, finite state machines may be used to control thread execution.

It will be appreciated that the various ones of the foregoing aspects of the present disclosure, or any parts or functions thereof, may be implemented using hardware, software, firmware, tangible, and non-transitory computer-readable or computer usable storage media having instructions stored thereon, or a combination thereof, and may be implemented in one or more computer systems.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. A method for thread-based scheduling within a multicore processor, comprising:
monitoring thread dependency counts of a plurality of threads in a control path logic of a core of the multicore processor, where the thread dependency counts of the plurality of threads are specific to the core of the multicore processor;
determining when a first thread of the plurality of threads is ready for execution;
assigning a processor resource to the first thread;
monitoring a utilization of the processor resource by the first thread; and
updating a first thread state of the first thread in the control path logic.

2. The method of claim 1, where the control path logic comprises a scoreboard of thread dependency counts.

3. The method of claim 1, where the control path logic comprises a ready queue of unblocked threads.

4. The method of claim 1, where the control path logic comprises a program buffer that stores execution progress for at least one blocked thread of the plurality of threads.

5. The method of claim 1, further comprising operating the core of the multicore processor asynchronously to an other core of the multicore processor.

6. The method of claim 5, further comprising sending an asynchronous instruction to update a second thread state of a second thread associated with the other core of the multicore processor.

7. The method of claim 5, further comprising receiving an asynchronous instruction from the other core of the multicore processor to update the first thread state of the first thread in the control path logic.

8. A core of a multicore apparatus, comprising:
a first logic configured to monitor a plurality of thread dependency counts corresponding to a plurality of threads, where the plurality of thread dependency counts are specific to the core of the multicore apparatus;
a second logic configured to determine when a first thread of the plurality of threads is ready for execution based on a first thread dependency count, where the first logic and the second logic are dedicated for thread control of the core;
a third logic configured to assign a processor resource to the first thread;
a fourth logic configured to monitor processor resource utilization of the first thread; and
a fifth logic configured to update the first thread dependency count for the first thread.

9. The core of claim 8, where the second logic is further configured to determine when at least one other thread of the plurality of threads is ready for execution based on at least one other thread dependency count.

10. The core of claim 8, where at least one of the third logic, the fourth logic, or the fifth logic manipulate addressable data within a shared memory resource.

11. The core of claim 8, where the plurality of thread dependency counts are determined at compile-time and stored in a non-transitory computer readable medium,
the first logic is configured to obtain the plurality of thread dependency counts from the non-transitory computer readable medium at program-time, and the fifth logic is configured to update the plurality of thread dependency counts during run-time execution.

12. The core of claim 8, where the fifth logic is configured to update the first thread dependency count for the first thread based on an other thread of the plurality of threads.

13. The core of claim 8, where the fifth logic is configured to update the first thread dependency count for the first thread based on an other thread of an other plurality of threads executed by an other core of the multicore apparatus.

14. The core of claim 8, where the fifth logic is further configured to update an other thread dependency count for an other thread of an other plurality of threads executed by an other core of the multicore apparatus.

15. A method for thread-based scheduling within a multicore processor, comprising:
distributing a first thread and a first thread dependency count to a first core;
distributing a second thread and a second thread dependency count to a second core;
monitoring the first thread dependency count of the first thread within a first control path logic of the first core and monitoring the second thread dependency count of the second thread within a second control path logic of the second core, where the first control path logic is dedicated for thread control of the first core and the second control path logic is dedicated for thread control of the second core; and
updating the second thread dependency count based on a first instruction of the first thread.

16. The method of claim 15, where the first control path logic comprises a first scoreboard for a first plurality of threads and the second control path logic comprises a second scoreboard for a second plurality of threads.

17. The method of claim 16, where the first control path logic further comprises a first program buffer that stores a first execution progress for the first thread and the second control path logic further comprises a second program buffer that stores a second execution progress for the second thread.

18. The method of claim 15, further comprising sending an asynchronous packet from the first core to the second core.

19. The method of claim 18, where the second control path logic of the second core enables non-blocking wait-free access.

20. The method of claim 15, further comprising setting the first thread dependency count to a first value based on an other instruction of the first thread.

* * * * *